United States Patent
Pajerski et al.

(10) Patent No.: US 10,650,172 B1
(45) Date of Patent: May 12, 2020

(54) SYSTEMS AND METHODS FOR IMPLEMENTING ITERATIVE SIMULATION MANIPULATIONS AND RESULTS DISPLAY

(71) Applicant: Ansys, Inc., Canonsburg, PA (US)

(72) Inventors: Vincent M. Pajerski, Canonsburg, PA (US); Joseph S. Solecki, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 476 days.

(21) Appl. No.: 15/492,107

(22) Filed: Apr. 20, 2017

Related U.S. Application Data

(60) Provisional application No. 62/325,074, filed on Apr. 20, 2016, provisional application No. 62/442,104, filed on Jan. 4, 2017.

(51) Int. Cl.
  *G06F 30/17* (2020.01)
(52) U.S. Cl.
  CPC .................................. *G06F 30/17* (2020.01)
(58) Field of Classification Search
  None
  See application file for complete search history.

(56) References Cited

U.S. PATENT DOCUMENTS

| | | | |
|---|---|---|---|
| 2013/0332119 A1* | 12/2013 | Santiquet | G06T 19/00 703/1 |
| 2015/0057982 A1* | 2/2015 | Erdman | G06F 17/50 703/1 |

OTHER PUBLICATIONS

University of Colorado Boulder, "About PhET", Mar. 21, 2015, https://phet.colorado.edu/en/about accessed at web.archive.org, 2 pages. (Year: 2015).*

* cited by examiner

*Primary Examiner* — Suzanne Lo
(74) *Attorney, Agent, or Firm* — Jones Day

(57) ABSTRACT

Systems and methods are provided for providing real-time interactive design and simulation of a physical system to generate comparisons of varying system configurations under different physical conditions. A display is generated on a graphical user interface that displays a part in a physical system according to characteristic data. An initial simulation of the physical system is executed to determine an initial value for a metric of the initial design. The initial value is displayed on the graphical user interface. A system configuration change is received through a user interface manipulation to a first characteristic of the characteristic data or the environment condition. The simulation of the physical system is recalculated to determine a second value for the metric based on the manipulated first characteristic, the second value for the metric being displayed on the graphical user interface along with initial value in real time relative to the received manipulation.

32 Claims, 23 Drawing Sheets

SYSTEMS AND METHODS FOR IMPLEMENTING ITERATIVE SIMULATION MANIPULATIONS AND RESULTS DISPLAY

CROSS-REFERENCE TO RELATED APPLICATIONS

This application claims priority to U.S. Provisional Application No. 62/325,074, filed Apr. 20, 2016, and to U.S. Provisional Application No. 62/442,104, filed Jan. 4, 2017, the entirety of both of which is herein incorporated by reference.

FIELD

This disclosure is related generally to the nearly-instantaneous simultaneous design and simulation of a physical system and more particularly to real-time iterative simulation and results display. A physical system in this context is, for example, a Mechanical Computer Aided Design (both individual parts and assemblies and their operating environment).

BACKGROUND

The engineering design process is a methodical series of steps that engineers use in creating functional products and processes. The design process is typically iterative, with parts of the process often needing to be repeated many times before a final design is selected. Engineering design and simulation (or modeling) is a process by which one ascertains information about how something will behave without "real world" testing. Simulation can be a useful tool in the engineering design process. But, the high costs of design and simulation in both time and computing resources (e.g., taking hours or days to run a single simulation) has hampered the usefulness of simulation during each iteration of a design process. Thus, simulation is often performed only once an engineer has come up with what they feel is a "good" candidate design.

SUMMARY

Systems and methods are provided for providing real-time interactive design and simulation of a physical system to generate comparisons of varying system configurations under different physical conditions. Data associated with an initial system configuration is accessed, where initial system configuration values include characteristic data associated with a part of the physical system, the characteristic data being indicative of one or more physical characteristics of a corresponding physical part. A display is generated on a graphical user interface that displays the part in the physical system according to the characteristic data. An initial design and an initial simulation of the physical system is executed to determine an initial value for a metric using a parallel processing architecture, the initial value for the metric being based on the characteristic data and an environment condition. The initial value is displayed on the graphical user interface. A system configuration change is received through a user interface manipulation to a first characteristic of the characteristic data or the environment condition, the first characteristic being associated with a physical characteristic of the part. The simulation of the physical system is recalculated to determine a second value for the metric based on the manipulated first characteristic, the second value for the metric being displayed on the graphical user interface along with initial value in real-time relative to the received manipulation. Iterative system configuration changes are received through successive user interface manipulations to characteristic data and, for each system configuration change, the simulation is recalculated based on the most recent manipulation to display subsequent values for the metric on the graphical user interface, where the display of the initial value, the second value, and the subsequent value indicate a progression of a design of the physical system across multiple configurations.

As another example, a processor-implemented system for providing real-time interactive simulation of a physical system to generate comparisons of varying system configurations under different physical conditions includes a common simulation data structure stored on a computer-readable medium configured to be utilized by multiple modules for sharing data associated with a physical system. A system of solvers operating on one or more data processors is configured to access data associated with an initial system configuration, where initial system configuration values include characteristic data associated with a part of the physical system, the characteristic data being indicative of one or more physical characteristics of a corresponding physical part, the solver system storing initial system configuration data in the common simulation data structure. The solver system is configured to execute an initial simulation of the physical system to determine an initial value for a metric using a parallel processing architecture, the initial value for the metric being based on the characteristic data and an environment condition, the solver system storing the environment condition and the initial value for the metric in the common simulation data structure. A post-processor operating on one or more data processors is configured to access the characteristic data, the environment condition and the initial value for the metric to generate pixel data based on a user-changeable point of view, the pixel data being stored in the common simulation data structure. A visualizer operating on one or more data processors is configured to access the pixel data and the initial value from the common simulation data structure and to generate a display on a graphical user interface that displays the part in the physical system from the point of view according to the characteristic data, the display further including a display of the initial value. Upon receiving a system configuration change through a user interface manipulation to a first characteristic of the characteristic data, the solver is configured to recalculate the simulation of the physical system to determine a second value for the metric based on the manipulated first characteristic, the second value for the metric being stored in the common simulation data structure and displayed on the graphical user interface by the visualizer along with the initial value in real time relative to the received manipulation.

DETAILED DESCRIPTION

Advances in simulation (or modeling) technologies have greatly increased the impact that simulation can have in the design process. For example, U.S. patent application Ser. No. 14/627,549, entitled "Systems and Methods for Three Dimensional Computation and Visualization Using a Parallel Processing Architecture," describes a parallel processing architecture that can, in some instances, provide real-time or near real-time (e.g., seconds, less than a minute, less than 5 minutes) simulation results. The entirety of U.S. patent application Ser. No. 14/627,549 is herein incorporated in its entirety.

Systems and methods as described herein take advantage of improved simulation speeds to incorporate simulation into multiple or even all iterations of an engineering design process. After a small number (e.g., one) of adjustments are made to an engineering design, a simulation is recalculated (or continued using the updated parameters dictated by the adjustments), with results being displayed on a graphical user interface in real time or near real time, such that the running of the simulation does not interfere with a subsequent adjustment of the engineering design. Behaviors of each iteration of the design can be visualized after each simulation recalculation, such that the designer can see whether the design has improved or regressed based on recent adjustments to the design. Once a design has reached a state that is acceptable to the designer, the design can be exported and implemented (e.g., a physical part can be fabricated according to the finished design).

Figure 1:
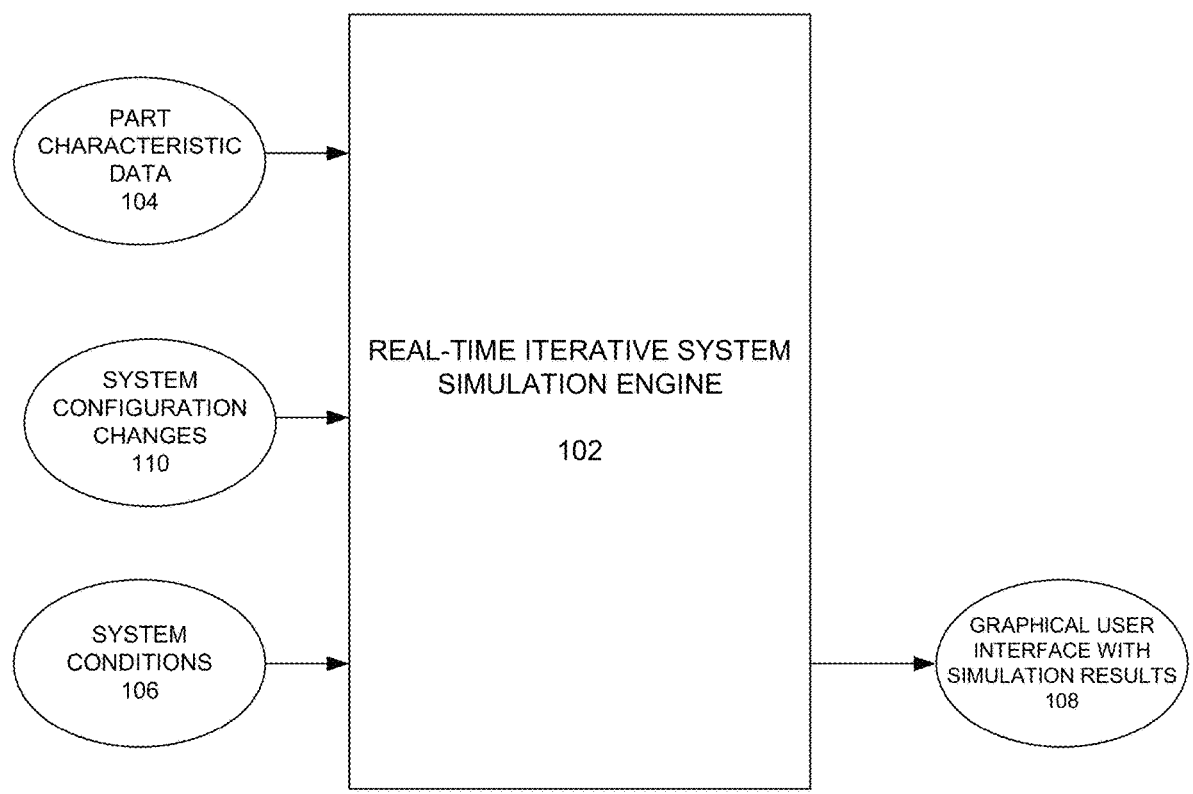
FIG. 1 is a block diagram depicting a processor implemented real-time iterative system simulation engine.

FIG. 1 is a block diagram depicting a processor implemented real-time iterative system simulation engine. A real-time iterative system simulation engine 102 receives part characteristic data 104 and system conditions 106 associated with an initial system configuration. The part characteristic data 104 is indicative of one or more physical characteristics of a corresponding physical part (e.g., a physical part that is undergoing an engineering design process). For example, part characteristic data 104 can include dimension (e.g., length, width, height) information, material composition information, as well as other physical characteristic data. The system conditions 106 may include environment conditions associated with an environment in which the physical part is being represented. Environment conditions can include a variety of characteristics of the physical system to be simulated including environment dimensions, boundary conditions, materials within the environment (e.g., air, water), as well as others.

The real-time iterative system simulation engine 102 provides a display on a graphical user interface 108 that displays the part in the physical system. The simulation engine 102 uses the part characteristic data 104 and the system conditions 106 to perform an initial simulation of the physical system, including determining an initial value for a metric (e.g., a temperature at a particular point of the part). The initial value is displayed on the graphical user interface as simulation results 108.

The real-time iterative system simulation engine 102 then receives a system configuration change 110 through a user interface manipulation (e.g., a mouse or keyboard command). The configuration change 110 may be an adjustment to the part characteristic data 104 or the system conditions 106. For example, a designer may adjust a physical dimension (e.g., length) of the part or may adjust a temperature associated with a boundary condition of the physical system. The simulation engine 102 recalculates the simulation of the physical system to determine a second value for the metric based on the characteristic change(s). The second value for the metric after the simulation recalculation is displayed, in real time or near real time relative to the system configuration changes, on the graphical user interface 108, in one embodiment, along with the initial value.

That process can then be repeated, where subsequent iterative system configuration changes 110 are received via successive user interface manipulations. For each system configuration change (or every n (e.g., 3) changes), the simulation is recalculated to display subsequent values for the metric on the graphical user interface 108 in real time as user interface manipulations to the physical system are made by the designer.

Figure 2A:
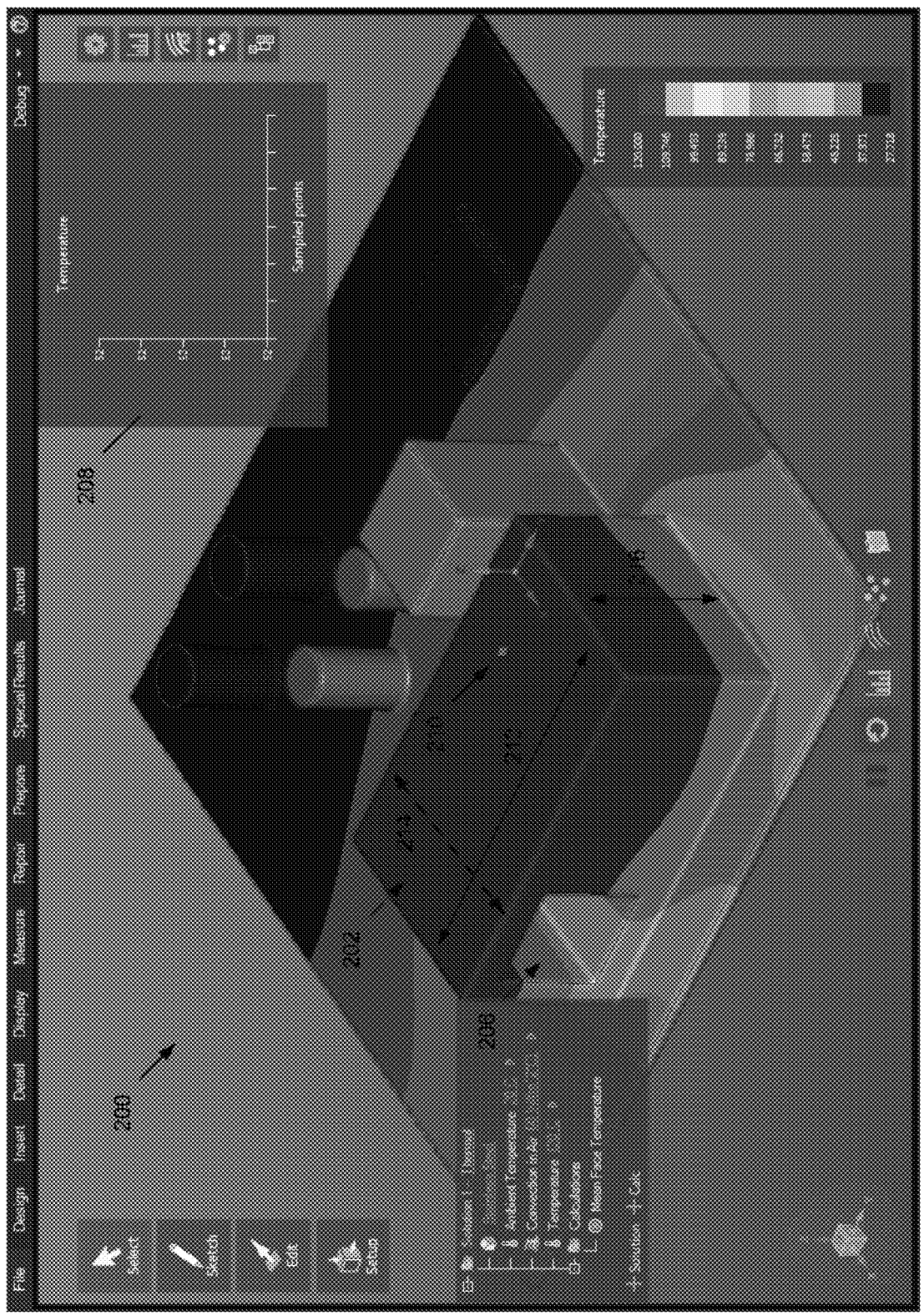
FIGS. 2A-2G depict example operations in an example graphical user interface provided by a real-time iterative system simulation engine.

FIGS. 2A-2G depict example operations in an example graphical user interface provided by a real-time iterative system simulation engine. FIG. 2A depicts a physical environment 200 that includes part being designed 202. The part 202 is a solid rectangular box shape having a box shape cutout, indicated at 206. The graphical user interface further includes a graph portion 208 where series of metric values in the graph portion 208 are displayed across multiple physical system configurations. In the example of FIG. 2A, a temperature metric value is plotted on the y-axis, with the graph advancing one unit along the x-axis for each physical system configuration created via user adjustment to the part 202 or the environment 200 (e.g., other parts, characteristics of the environment). In the example of FIG. 2A, only one metric (i.e., temperature at the point labeled 210) is plotted on the graph. In other examples, multiple metrics (e.g., temperature at 210, a stress at an interior wall of block cutout 206, and a vibration magnitude at another point in the system 200).

In the graph portion 208, a first value for each displayed metric corresponds to an initial configuration of the physical system, where second, third, and fourth graphed values illustrate subsequent values for each of those metrics at respective, subsequent physical system configurations. The graphical user interface, in one embodiment, explicitly identifies metric values (e.g., 125.1, 100.0 and 95.72) for each of the metrics being tracked for the current physical system configuration. The metric values depicted in the graph portion may be of the same type (e.g., temperatures at different points in the part 202 or the physical system 200) or disparate type. In the graph portion 208 of FIG. 2A, Sampled points on the X-Axis, indicates a set of system configuration values (e.g., a part characteristic, an environment condition) that can be manipulated, where the Y-Axis represents metric values are simulated based on the set of system configuration values at the Sampled points.

In operation, a designer manipulates a system configuration value of the physical system 200. A simulation of the physical system 200 is recalculated based on the manipulation, and the graph portion 208 is updated to add a new metric value for each of the metrics being tracked. For example, a designer could change a length 212, a width 214, or a height 216 of the part 202 or a width or height of the cutout portion 206 present in the part 202.

Figure 2B:
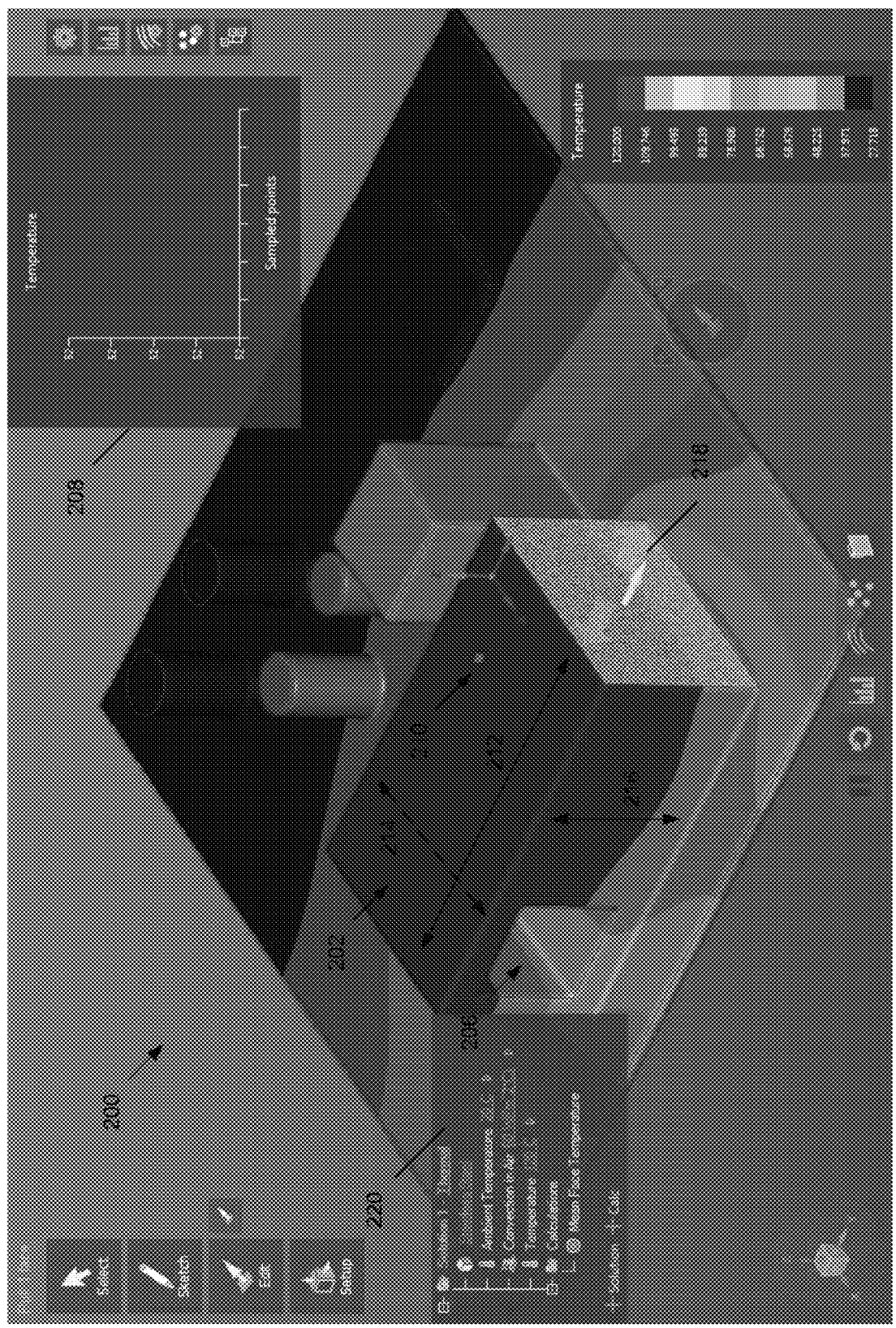

In the example of FIG. 2B, a designer is currently manipulating a length 212 of the part 202 via a mouse drag and drop operation indicated at 218. Other, non-dimensional characteristics of the part 202 can also be manipulated, such as a part material (e.g., using part setup pane 220. In addition to part characteristic data manipulations, a designer could manipulate system conditions that represent the environment of the part 202. For example, a designer could manipulate an ambient temperature of the volume in which the part 202 resides, a type of material (e.g., liquid, gas) surrounding the part 202, or a material flow (e.g., wind) in the portion of the physical system 200 in which the part 202 resides. In one embodiment, the graph portion 208 is updated based on each such manipulation of the physical system 200 or the part 202, moving to a new Sampled point after each manipulation (or after certain periods of time, such as every 30 seconds).

Figure 2C:
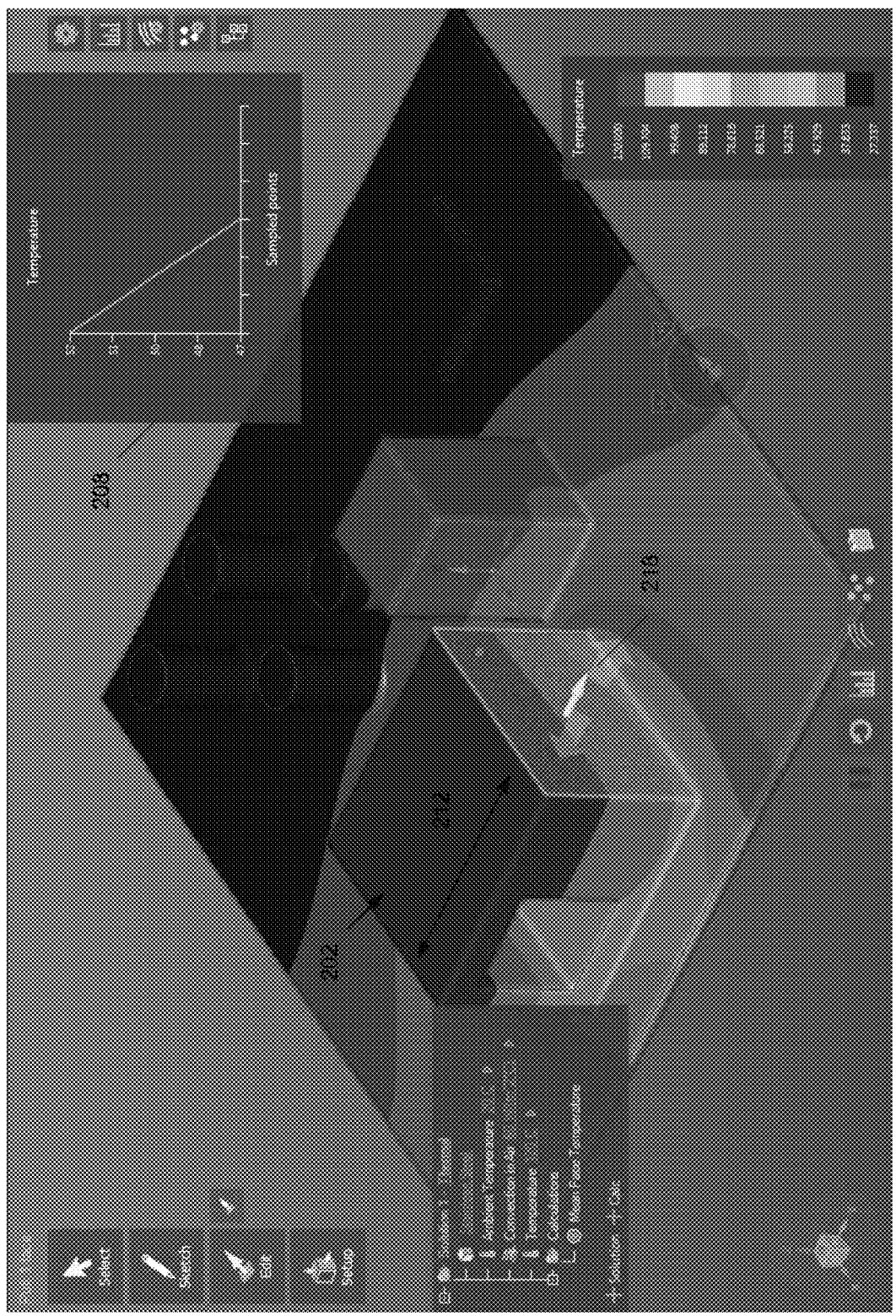
Figure 2D:
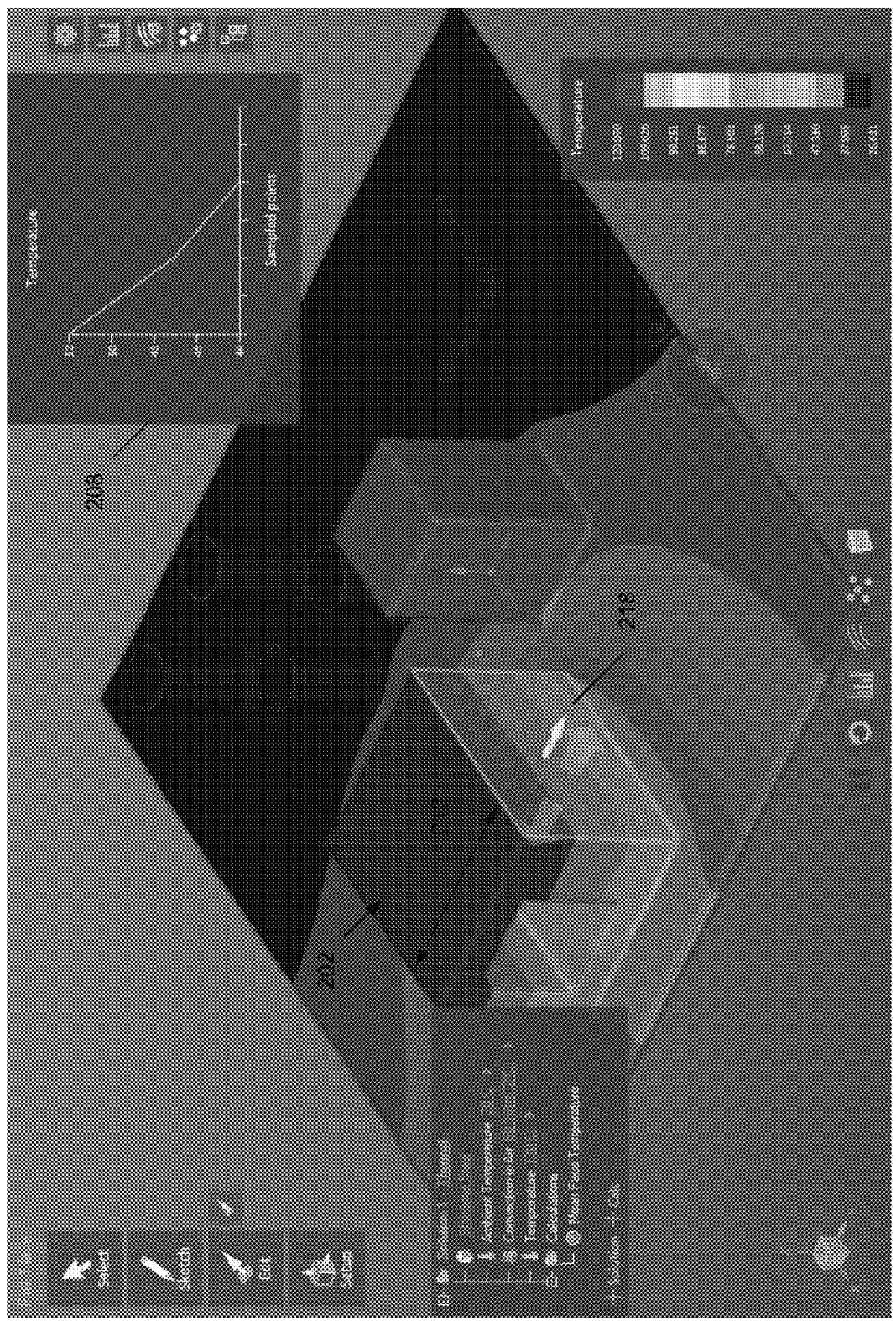
Figure 2E:
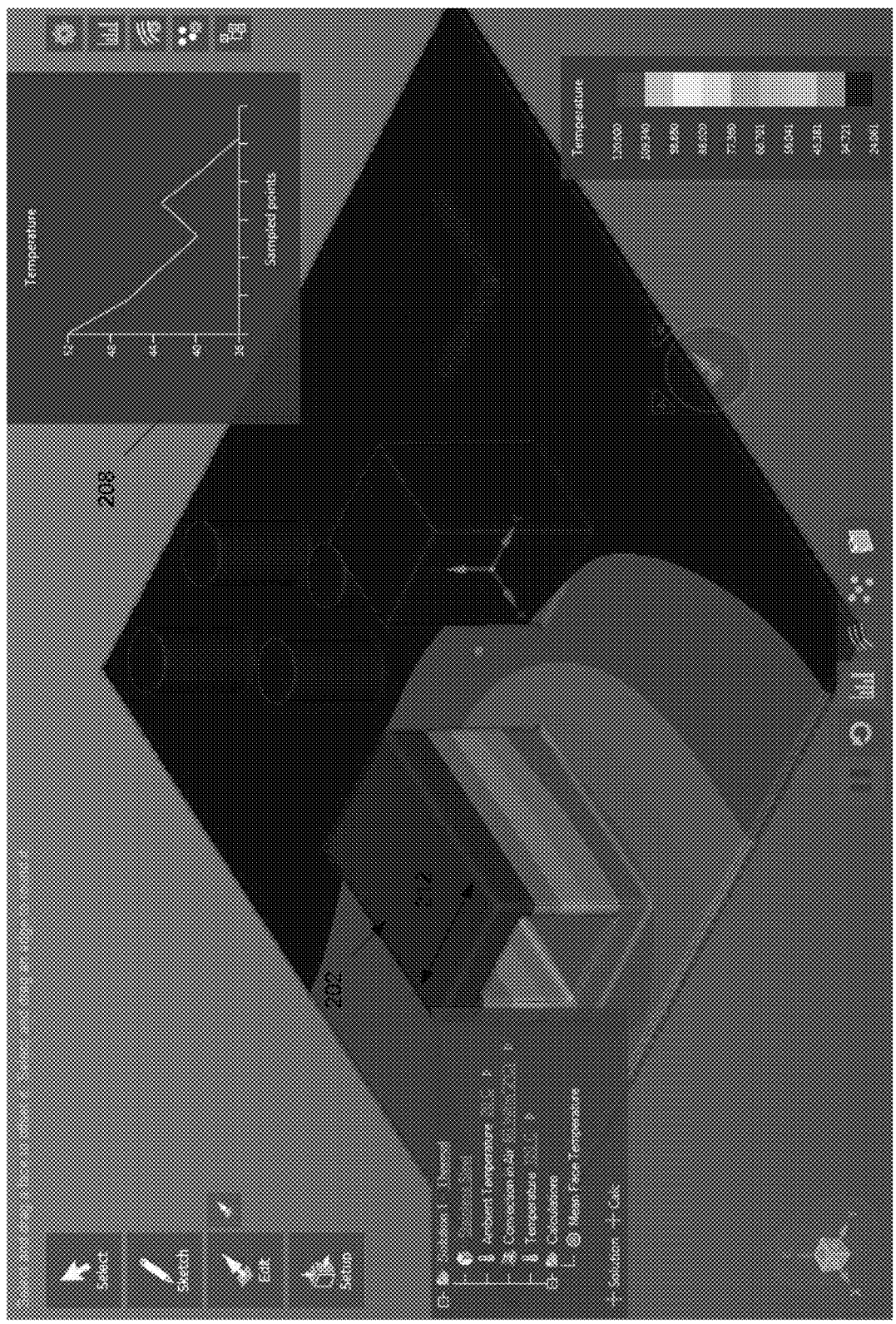

FIG. 2C depicts the graphical user interface after three manipulations have been made, while a fourth manipulation is currently being made to the length 212 of the part. As can be seen in the graph portion 208, a new temperature reading is plotted for each manipulation of the system. At the point depicted in FIG. 2C, three manipulations have been made to the system since an initial state, where the temperature was 52 degrees, to the current state, where the temperature is 47 degrees. Updating the graph portion 208 in this way, after each manipulation of the environment, enables an iterative design optimization process, where a user can make a change to parameters of the system and see how those changes affect a critical parameter in real time as the changes to the parameters are made. FIG. 2D depicts the graphical user interface after five manipulations have been made (e.g., step-wise reducing the length 212 of the part 202), where the graph portion 208 indicates that the temperature at the point of interest has dropped to 44 degrees. FIG. 2E depicts the graphical user interface after seven manipulations have been made, where the graph portion 208 indicates that the temperature at the point of interest has fluctuated between 52 degrees and 36 degrees as manipulations have been made.

Figure 2F:
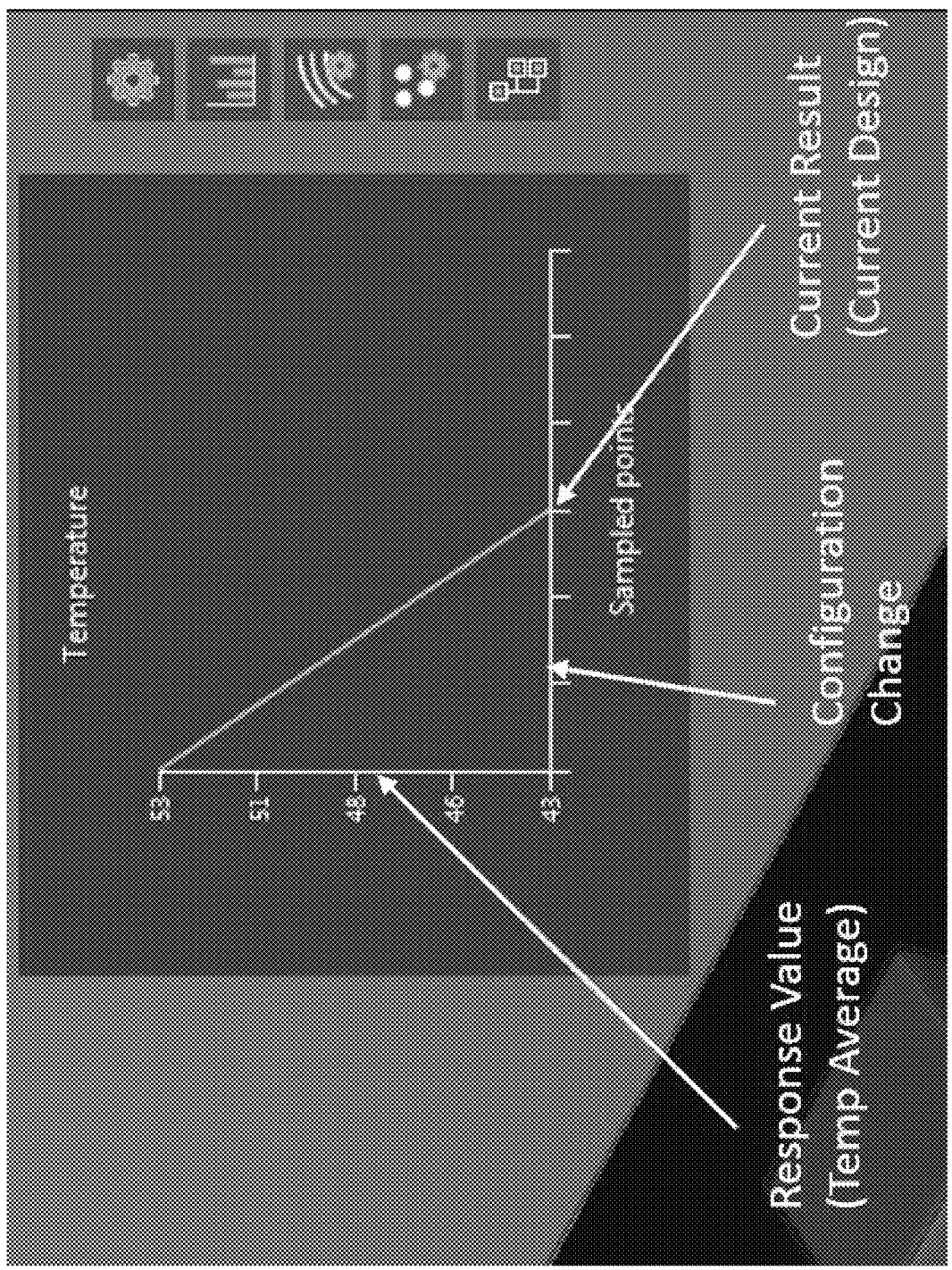

In the examples of FIG. 2A-2E, additional data is presented on the graphical user interface in the form of a color temperature overlay, illustrating temperatures at different points on the surface of the part 202 and other components of the system 200. FIG. 2F is an annotated view of the graph portion indicating the response value metric of interest on the y-axis, the Sampled points corresponding with configuration changes on the x-axis, and the changes to the metric of interest, including to a current result based on the current design depicted in the environment.

In one embodiment, the real-time iterative system simulation engine is capable of updating the simulation, and thus the metric values depicted in the graph portion in real time or near real time with the system configuration changes. For example, upon releasing the mouse drag operation that is currently being performed to adjust the length 212 of the part 202, the simulation engine can recalculate the simulation and provide updated metric data via successive points in the graph portion 208 fast enough (e.g., usually within a second); thus, recalculating the simulation and updating the graphical user interface does not interfere with the designer making a next manipulation of the system configuration. In certain embodiments, a recalculation of the simulation is performed via a complete restart (i.e., the simulation returns to its initial state) of the simulation; whereas in other embodiments, the simulation proceeds from its current state and its results can be leveraged to speed simulation recalculation.

Figure 2G:
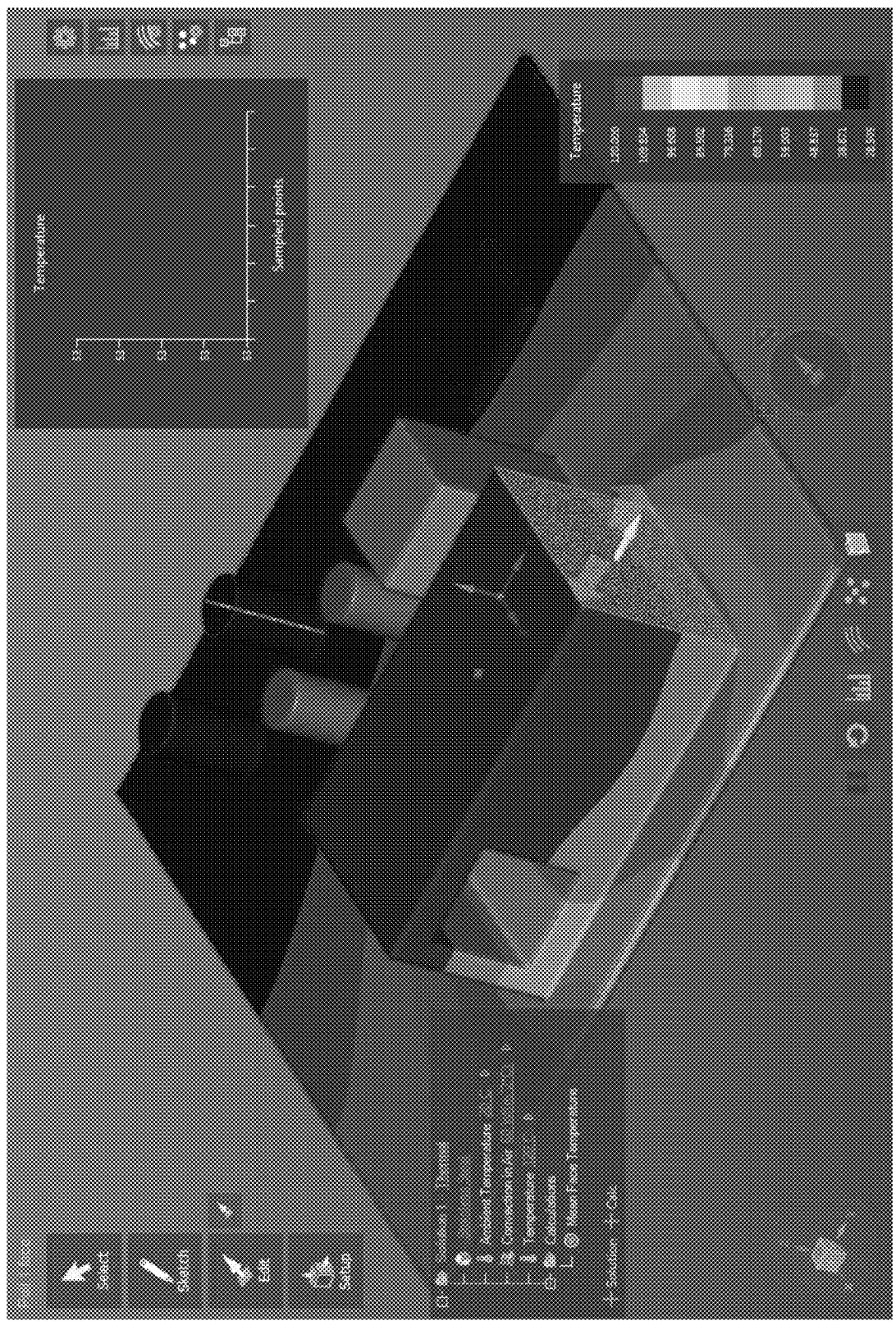

In certain embodiments, additional visualization controls are enabled by the graphical user interface. Such controls can enable a designer to rotate the depicted physical system 200 to visualize the part 204 from different perspectives. The physical system 200 can also be resized (e.g., to let the designer visualize an important portion of the part 202 close up). FIG. 2G depicts the graphical user interface displaying the physical system 200 rotated about the X-Axis.

Figure 3:
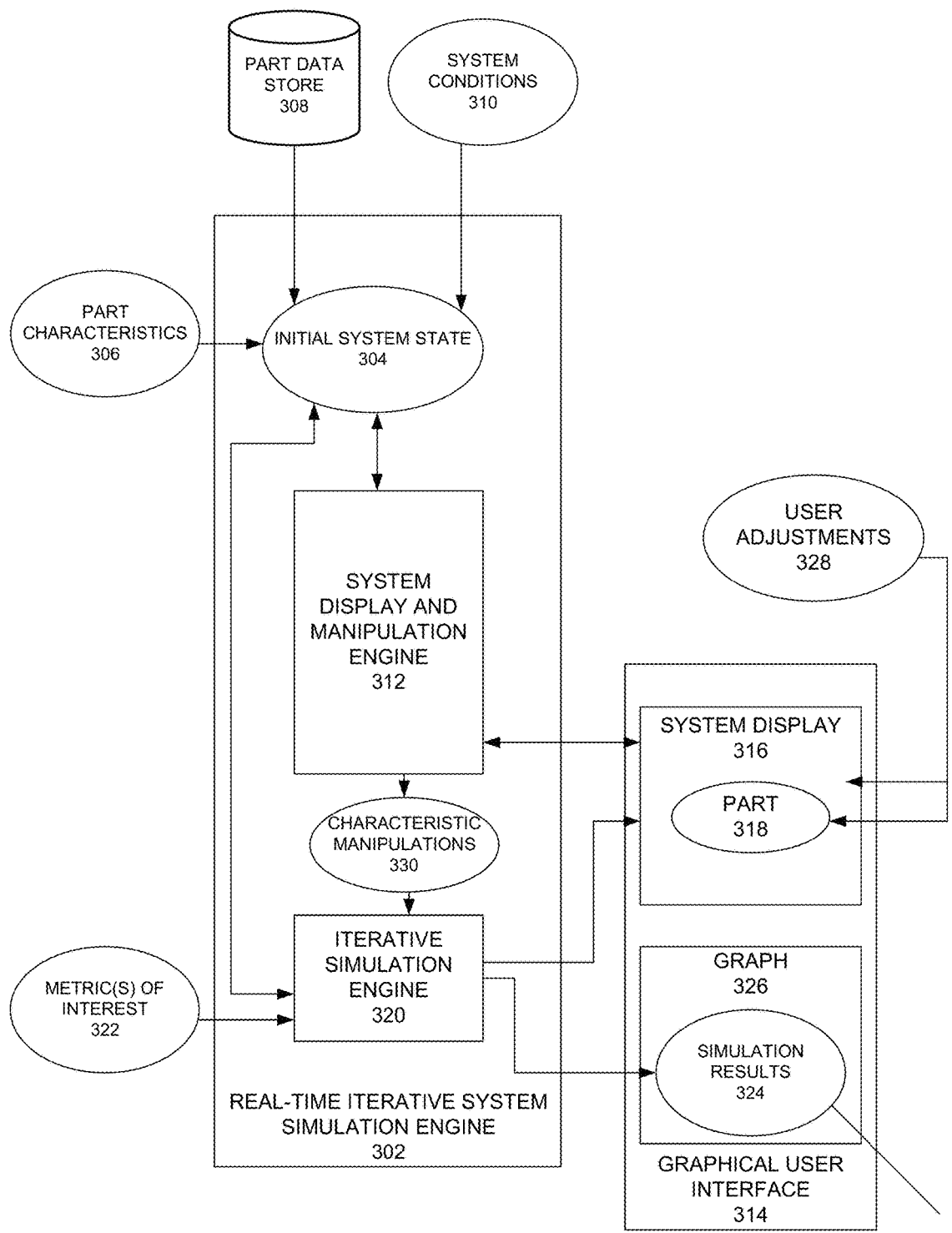
FIG. 3 is a diagram depicting interaction of example components of a real-time iterative system simulation engine.

FIG. 3 is a diagram depicting interaction of example components of a real-time iterative system simulation engine. A real-time iterative system simulation engine 302, receives data, such as from a designer, that makes up an initial system state 304 of a physical system. For example, the simulation engine 302 may receive characteristic data 306 associated with a part of the physical system. Such a part may be designed from scratch by the designer (e.g., by entering dimension, material, and other properties of the part), or the part may be defined in part based on a template or previously worked-on part accessed from a part data store 308. The characteristic data that makes up the initial system state 304 may also include system conditions 310 of the physical system, such as environment conditions that define characteristics of the environment in which the part resides.

The initial system state data 304 is interactively provided to a system display and manipulation engine 312 that interacts with a graphical user interface 314 to provide a system display 316 that depicts the physical system. The system display 316 includes a depiction of the part 318 and may include indicators of the environment conditions (e.g., moving liquid or gas particles) in the environment in which the part resides. The system display and manipulation engine 312 and the system display 316 can be used in helping a designer set up the initial system state 304, such as by providing drag and drop controls for adding, removing, and manipulating components of the part 318 and otherwise defining characteristics of the part 318 and its environment.

Figure 4:
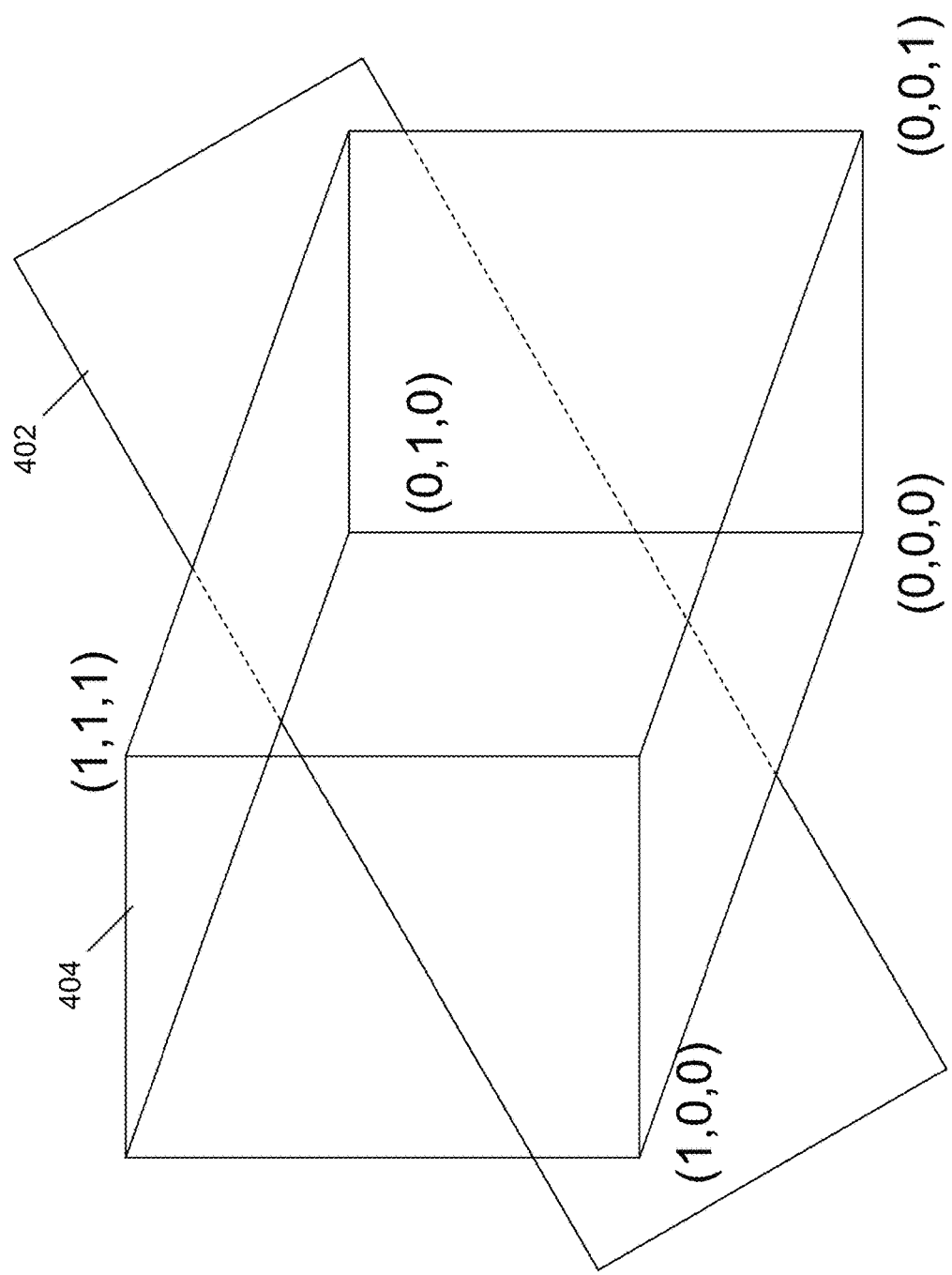
FIG. 4 is a diagram depicting a plane that intersects a volume, where the volume represents the physical system under consideration.

Once the initial system state 304 has been set by a designer, that initial system state 304 is provided to an iterative simulation engine 320 along with an indication of one or more metrics of interest 322. A wide variety of directly simulated or derived values can be provided as simulated metric values by the iterative simulation engine 320. Example metrics of interest include temperatures, structural deformations, heat flows, stresses, strains, velocities, pressures, voltages, electric fields, and magnetic fields. Derived values of those metrics can include maximum response values, minimum response values, mean response values, maximum response flux, and mean response flux, where fluxes can include heat flows, fluid flows, electric currents, and electrical or magnetic field flows. Metrics of interest 322 can be measured relative to different geometric boundaries (a measurement entity), as is appropriate. For example, a temperature metric could be measured at a designer-identified point in the volume of the physical system, where a maximum or average temperature could be measured relative to the entire volume of the physical system or of some sub-portion of the physical system. FIG. 4 is a diagram depicting a plane 402 that intersects a volume 404, where the volume represents the physical system under consideration. A maximum, minimum, or average temperature of all points on that plane 402 within the volume 404 could be provided as a metric of interest. As another example, a total amount of a flux of interest through the plane 702 could be provided as a metric of interest.

Figure 5:
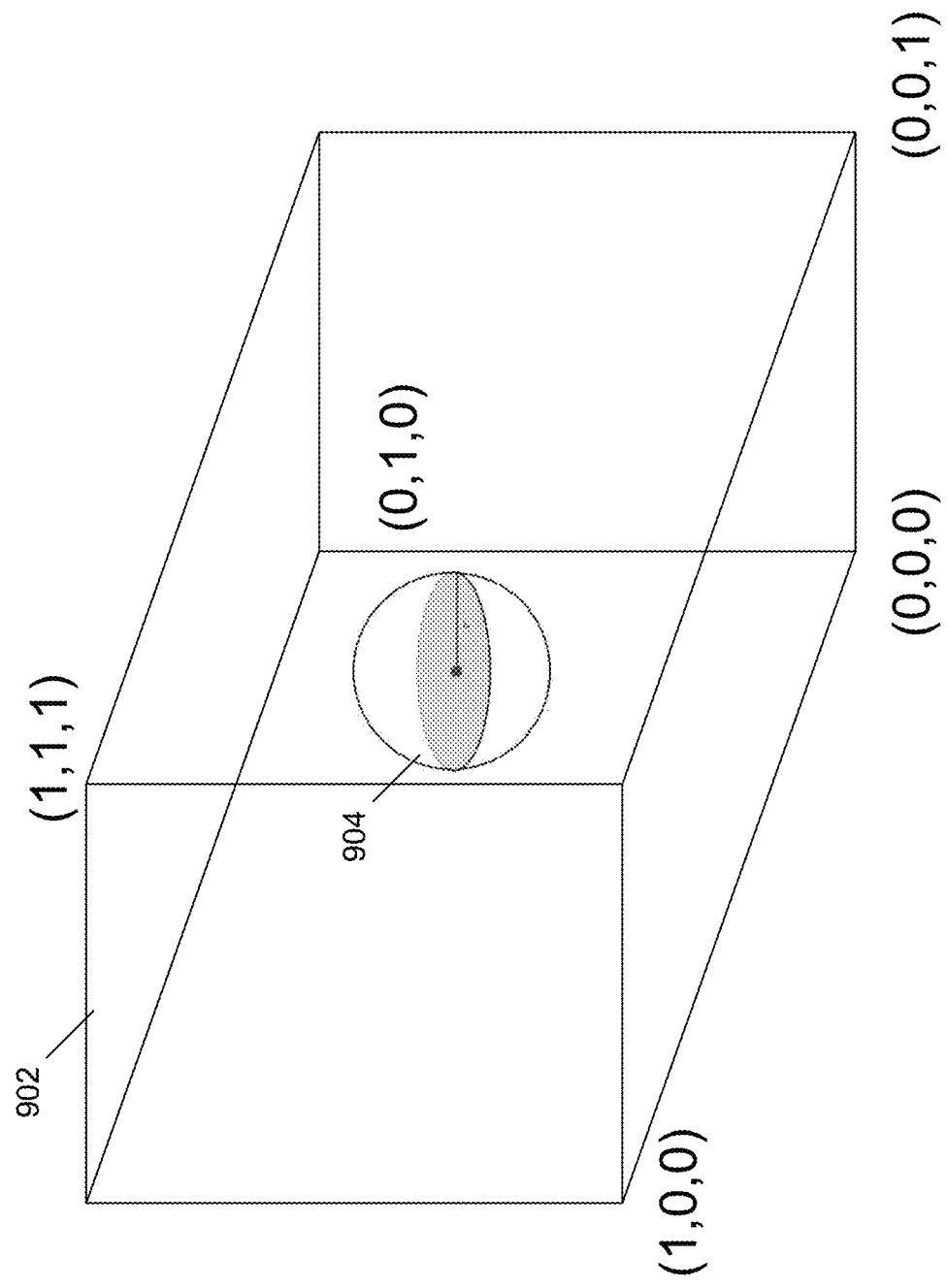
FIG. 5 depicts a sphere within a volume representing the physical system.
Figure 6:
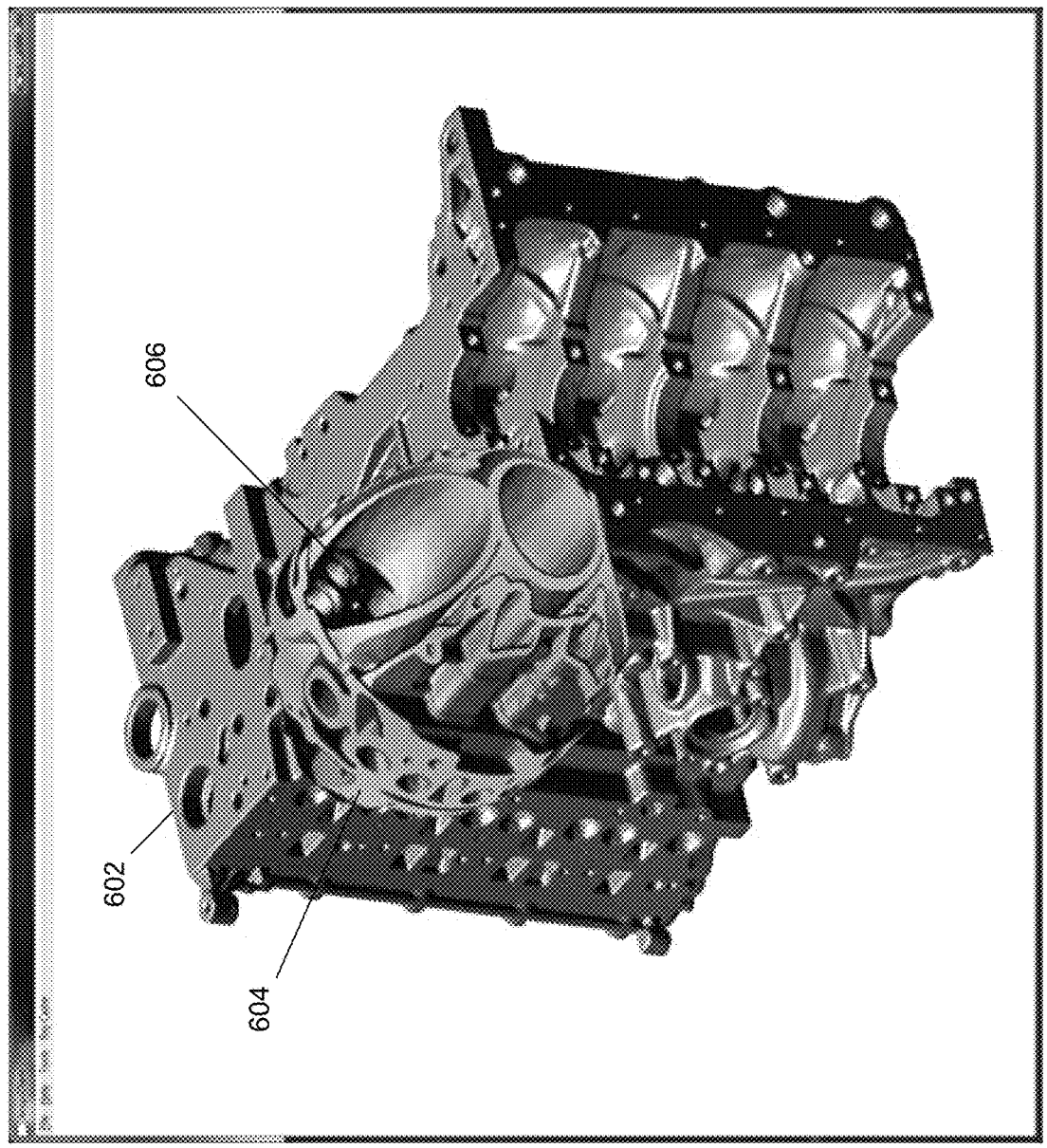
FIG. 6 is a diagram depicting interaction of a sphere geometric shape positioned within a part on a system display.

Other geometric shapes can also be utilized, such as points, edges, lines, surfaces, volumes, or spheres. For example, FIG. 5 depicts a sphere 904 within a volume 902 representing the physical system. In one example, a maximum stress or strain of all points on the surface of the sphere 904 or within the sphere 904 volume could be identified as a metric of interest. FIG. 6 is a diagram depicting interaction of a sphere geometric shape positioned within a part on a system display. There, a part 602 is depicted on a system display and a sphere 604 geometric shape is defined within the part 602. The system display and manipulation engine is configured to prioritize points of the part in the sphere 604 over points on the part that intersect with a line from the center of the physical system to a point of view of the system display, such that the portions of the part within the sphere are depicted on the system display. In the example of FIG. 6, a maximum temperature within the sphere is selected as a metric of interest, where a red indication at 606 identifies the location of that maximum temperature. The temperature at that point would be depicted in a graph of simulation results, as discussed further herein. In one embodiment, the measurement entity can be adjusted (e.g., resizing or repositioning the sphere), where a value for the metric of interest is recalculated based on the redefined measurement surface.

With reference back to FIG. 3, having received the initial system state 304 and metric of interest 322, the iterative simulation engine 320 executes an initial simulation of the physical system. The iterative simulation engine 320, in one example, uses a parallel processing architecture to quickly determine an initial value for the metric of interest 322 based on the part characteristic data 306 and the environment system conditions 310. The iterative simulation engine 320 displays the initial value for the metric of interest 322 as simulation results 324 on a graph portion 326 of the graphical user interface 314 (e.g., as a first point on a line graph or as an indicator on another type of graph). The iterative simulation engine 320 may further adjust the physical system display portion 316 of the graphical user interface 314, such as to provide the color metric overlays (e.g., as depicted in FIGS. 2 and 6).

Figure 7:
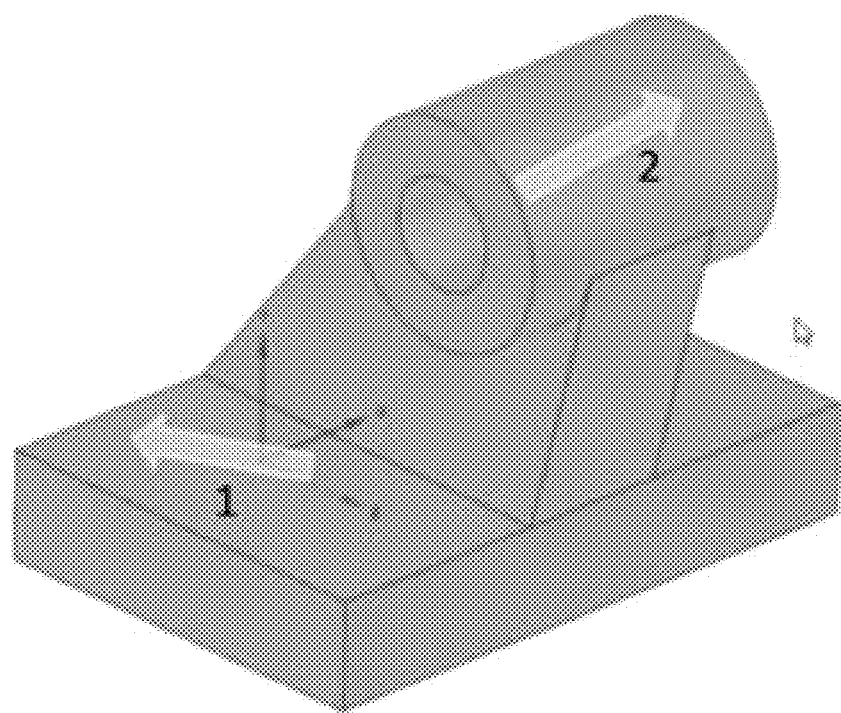
FIG. 7 is a diagram depicting example adjustments to a part that can be made via drag and drop operations.

Having performed the initial simulation, the real-time iterative system simulation engine 302 receives a system configuration change through a user interface manipulation, as depicted at 328. The user adjustments 328 can include adjustments to the parts in the physical system (e.g., dimensions, material characteristics) or to environment conditions within the physical system. Those adjustments, which could be affected by mouse commands, touch screen commands, keyboard data value entry, or otherwise, are depicted on the system display 316 via interaction with the system display and manipulation engine 312. FIG. 7 is a diagram depicting example adjustments to a part that can be made via drag and drop operations, where a width (1) of a first portion of the part can be changed by clicking and dragging in one direction, while a length (2) of a second portion of the part can be changed by clicking on that portion and dragging in an orthogonal direction. The input controls representing user adjustments 328 are translated by the system display and manipulation engine 312 into characteristic manipulations 330, which might include adjustment to part characteristics or environment conditions. Those characteristic manipulations 330 are provided to the iterative simulation engine 320, which recalculates the simulation of the physical system to determine a second value for the metric of interest 322 based on the characteristic manipulations 330. The second value for the metric is provided to the graphical user interface 314 for display on the graph portion 326 along with the initial value (e.g., as a second point on a line graph).

The process can then be repeated, where more user adjustments 328 (to the same or different characteristics of the part or environment of the physical system) are received via the graphical user interface 314, where the system display 316 is updated and the simulation is recalculated. Further values for the metric of interest 322 are provided as simulation results 324 along with prior metric of interest 322 values from previous iterations. In this way, a designer can participate in trial and error design, seeing how each change to the physical system affects metrics of interest to the designer, enabling semi-automatic optimization without using optimization algorithms, which can be very complex and time consuming for non-trivial designs. The iterative simulation engine 320 is able to recalculate the simulation results quickly (e.g., in less than 5 seconds) so that recalculating the simulation and updating the graphical user interface 314 provides little to no interference with receipt of a next user adjustment 328 to the physical system.

Figure 8:
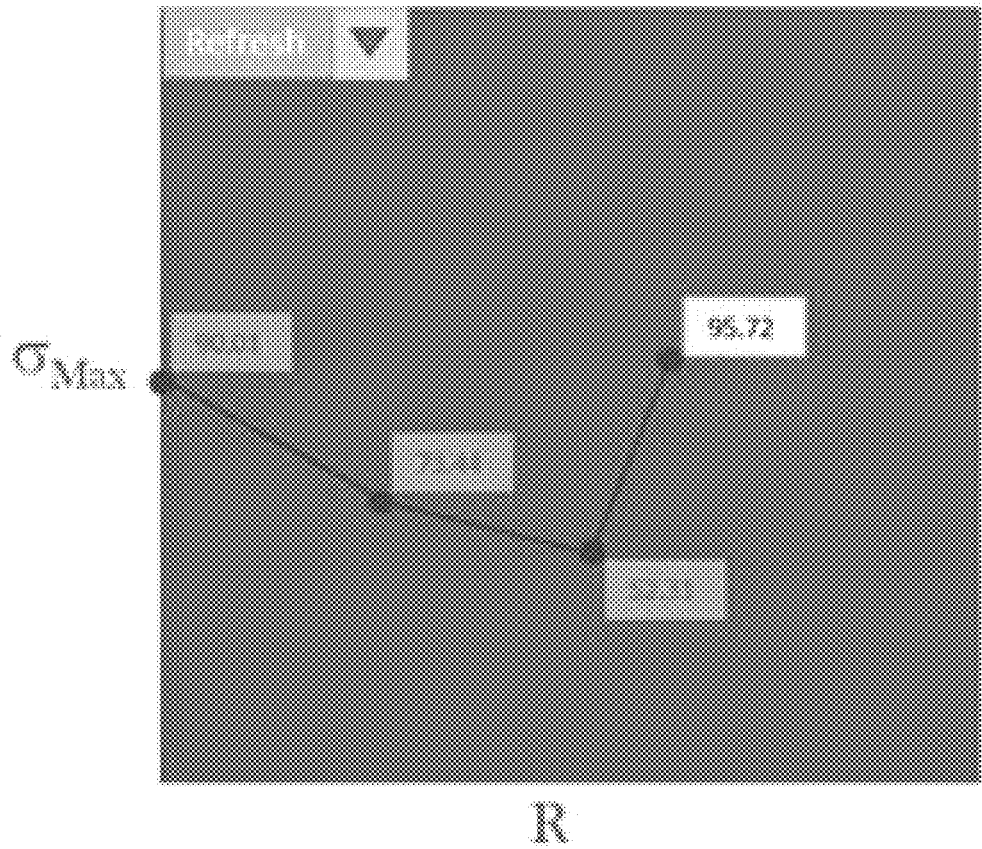
FIG. 8 is a diagram depicting example simulation results for a metric of interest.

FIG. 8 is a diagram depicting example simulation results for a metric of interest. The x-axis indicates different physical system configurations (R's) for which simulation calculations are performed. The y-axis displays values for a metric of interest (σ's) at each of those configurations. In the example of FIG. 8, the metric of interest is a max temperature of a part on a plane that intersects the part within the physical system. An initial value for the metric, determined by an initial simulation was 90.01 and is depicted as a left most point on the line graph. Following a first user adjustment to the physical system, the temperature dropped to 73.44, depicted as the second point on the graph. If the goal is to minimize temperature in that plane, then this user adjustment was a good adjustment. Following a second user adjustment, the temperature further fell to 52.31. But, a third adjustment resulted in an increased maximum temperature in the plane to 95.72, illustrated by the fourth point on the line graph. This may indicate that the third adjustment did not help the design, but instead was a suboptimal adjustment. Based on this, the user may decide to undo the third adjustment and make different adjustments, or accept the physical system as it exists after the second adjustment as a final design and fabricate the part accordingly.

Figure 9:
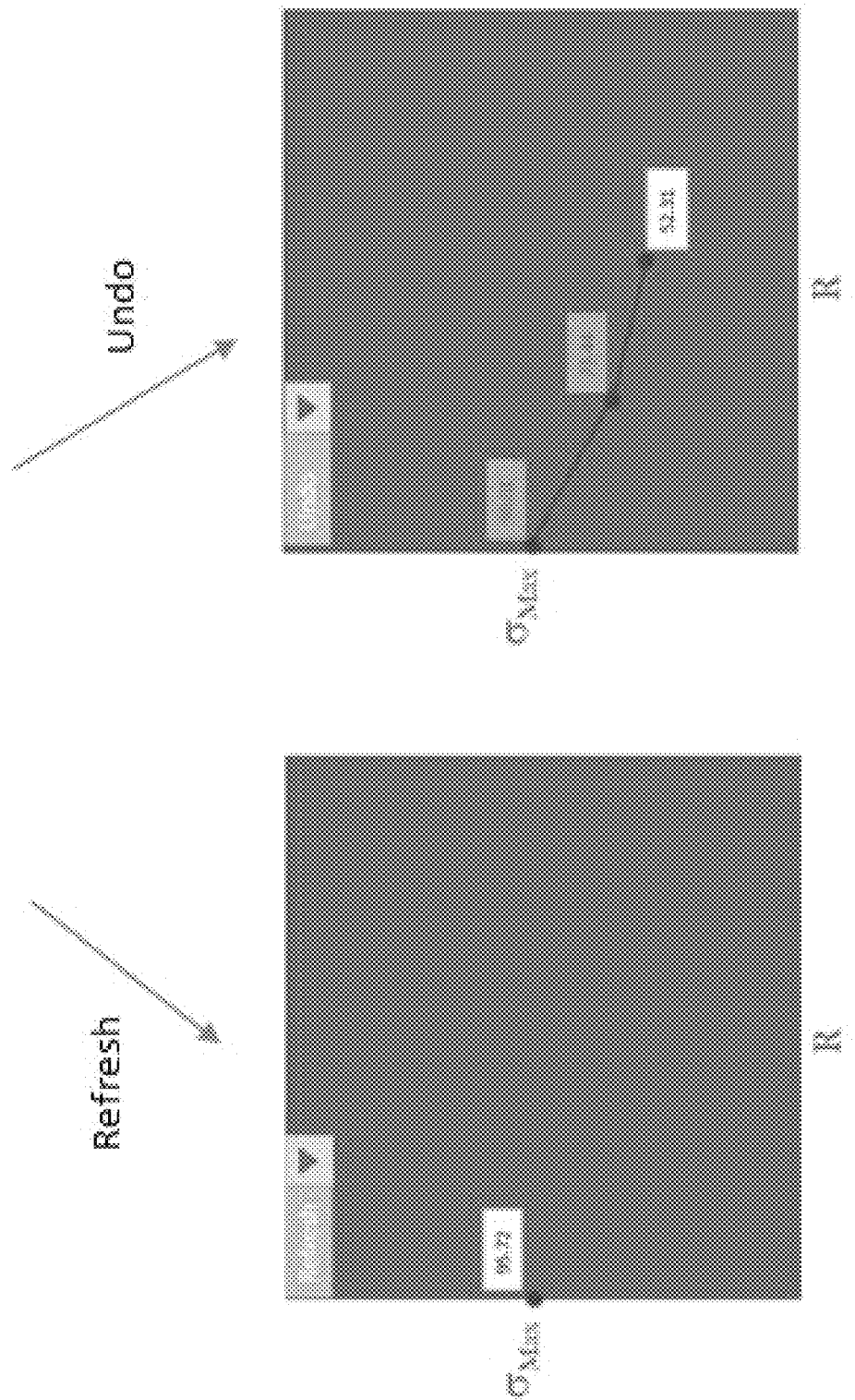
FIG. 9 depicts example graph and iterative simulation controls.

FIG. 8 depicts four data points for the metric of interest, representing 3 design changes with respect to the initial design, with the last data point indicating a metric value of 95.72 based on a third adjustment to the physical system. FIG. 9 depicts iterative simulation controls that indicate the results of Refresh and Undo actions. If the designer wishes to have prior simulation result values for that metric be cleared from the graph display, the designer can issue a Refresh command, as indicated in the left graph of FIG. 9. The Refresh command does not alter the current state of the physical system; it merely refreshes the displayed results and the present design is now initial and only design. A designer may wish to issue a Refresh command when the designer is happy with a current state of the design of the physical system, from which the designer does not wish to go back.

Figure 10:
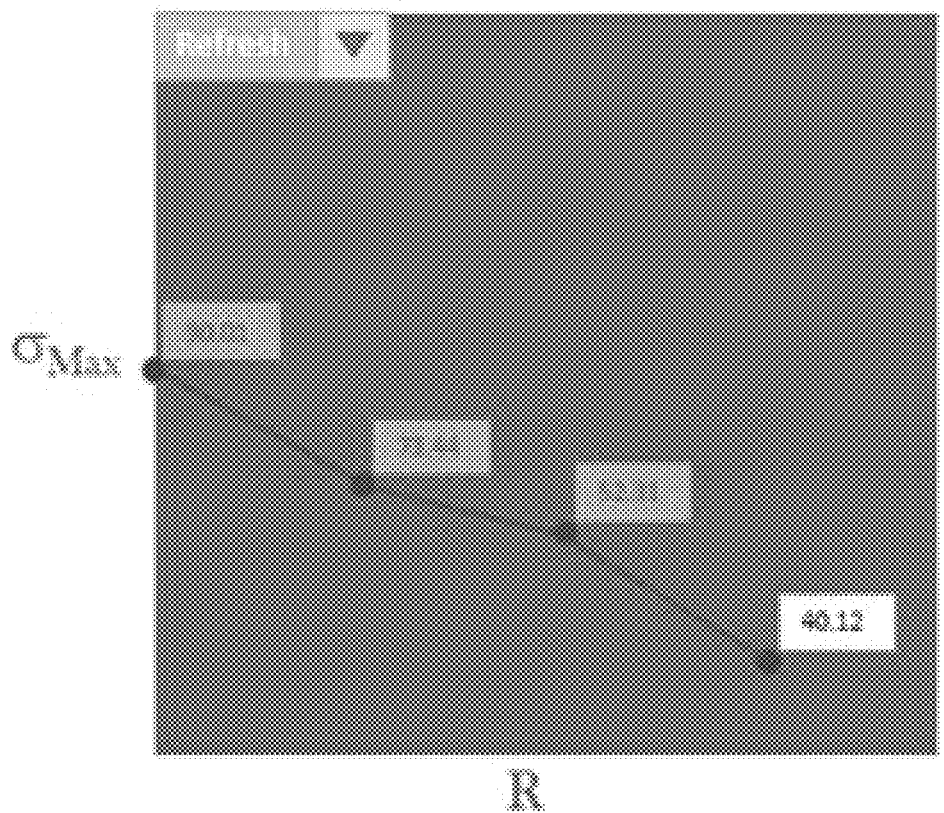
FIG. 10 depicts the graph portion after a new third adjustment is made by the designer.

The right graph of FIG. 9 depicts the results of an Undo command on the graph display. If the third adjustment discussed with respect to FIG. 8, resulting in a metric of interest value of 95.72, is determined by the designer to be undesirable, the designer can issue an Undo command. The Undo command reverts the state of the physical system to its state after the second adjustment. The system display is modified to depict the physical system as it existed after the second adjustment, and the graph display is augmented as depicted in the right graph of FIG. 9 to remove the fourth metric of interest value of 95.72. Such an undo action can be accomplished using a stack data structure that stores the state of the physical system at each adjustment along with metric of interest values corresponding to those adjustments. After the Undo command is performed, the designer can then make a different adjustment, and the simulation will be recalculated with a new metric of interest value displayed. FIG. 10 depicts the graph portion after a new third adjustment is made by the designer, where the metric of interest value is simulated to fall to 40.12.

Figure 11:
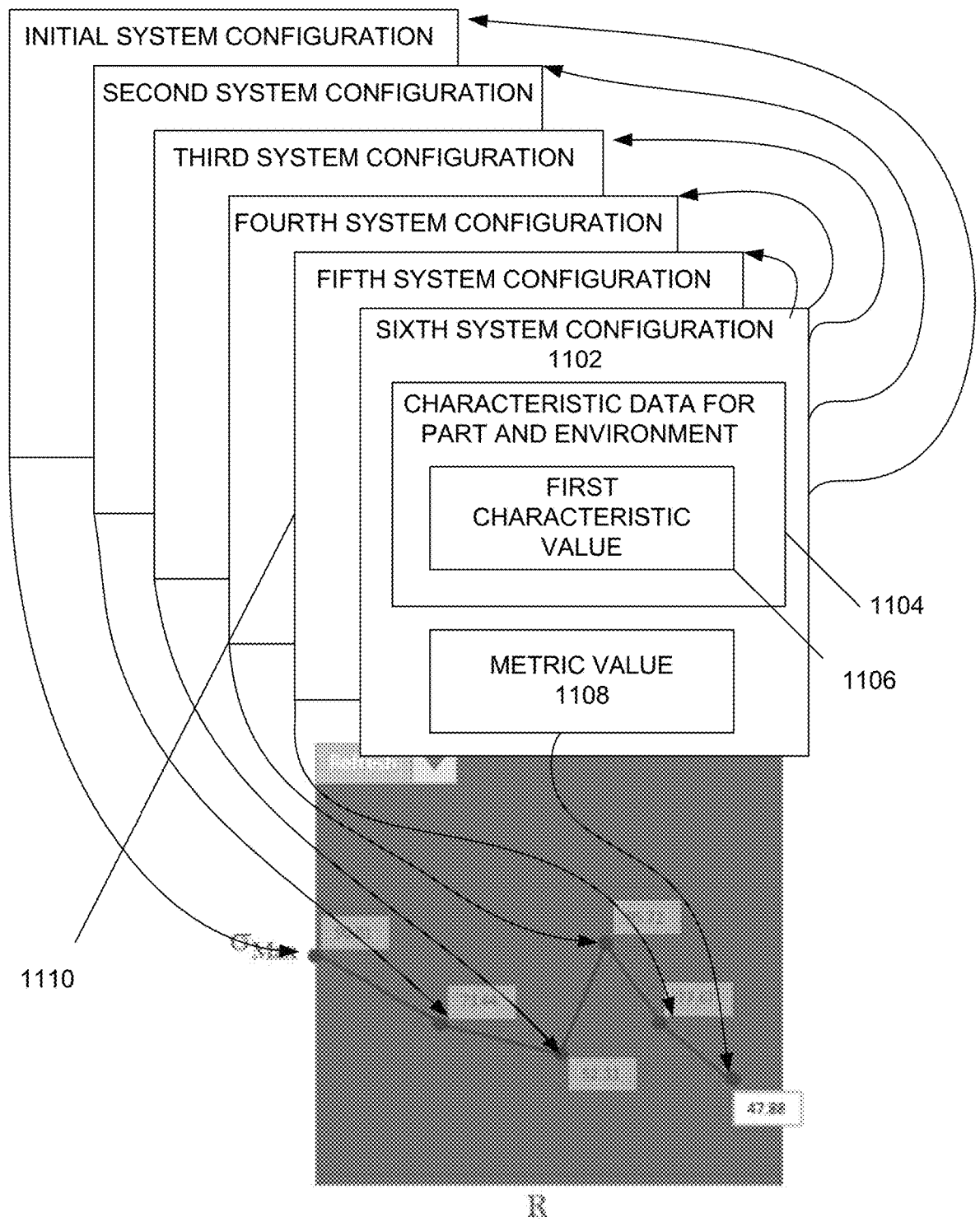
FIG. 11 is a diagram depicting an example stack data structure for storing physical system states and metric of interest values.

FIG. 11 is a diagram depicting an example stack data structure for storing physical system states and metric of interest values. For each physical system configuration, a linked list record is created. Referencing a linked list record for a sixth system configuration 1102, the record includes a data structure 1104 for storing data associated with the current state of the physical system. The data structure stores current values for each of a number of parameters of the physical system, such as the depicted first characteristic value 1106 associated with a part in the physical system. Other characteristic data in the record 1104 details other parameters of the parts in the physical system, as well as environment conditions present in the current state of the physical system. The system configuration data record 1102 also stores a metric value 1108 for the metric of interest. As depicted in FIG. 11, the metric value for the sixth system configuration is 47.88. Having the physical system parameters and the metric values for each system configuration stored in the linked list data structure enables easy transitions to past system configurations. Using a single- or double-linking, the linked list can be operated as a stack, where a new linked list record can be pushed onto the stack when a new user adjustment is received, and a top linked list record can be popped off of the stack when an undo command is received. In the example of FIG. 11, an undo command would result in the sixth system configuration linked list record 1102 being popped off of the stack, the system display being adjusted to represent they physical system according to the characteristic data structure contained in the fifth system configuration linked list record 1110, and the graph portion of the graphical user interface being updated to display the metric of interest value stored in the fifth system configuration linked list record 1110 as the final point in the line graph. In one embodiment, in addition to being able to revert back a single iteration via an undo command, a reversion to any of the physical system configurations represented by points on the graph can be achieved via a selection of the corresponding point on the graph.

Figure 12:
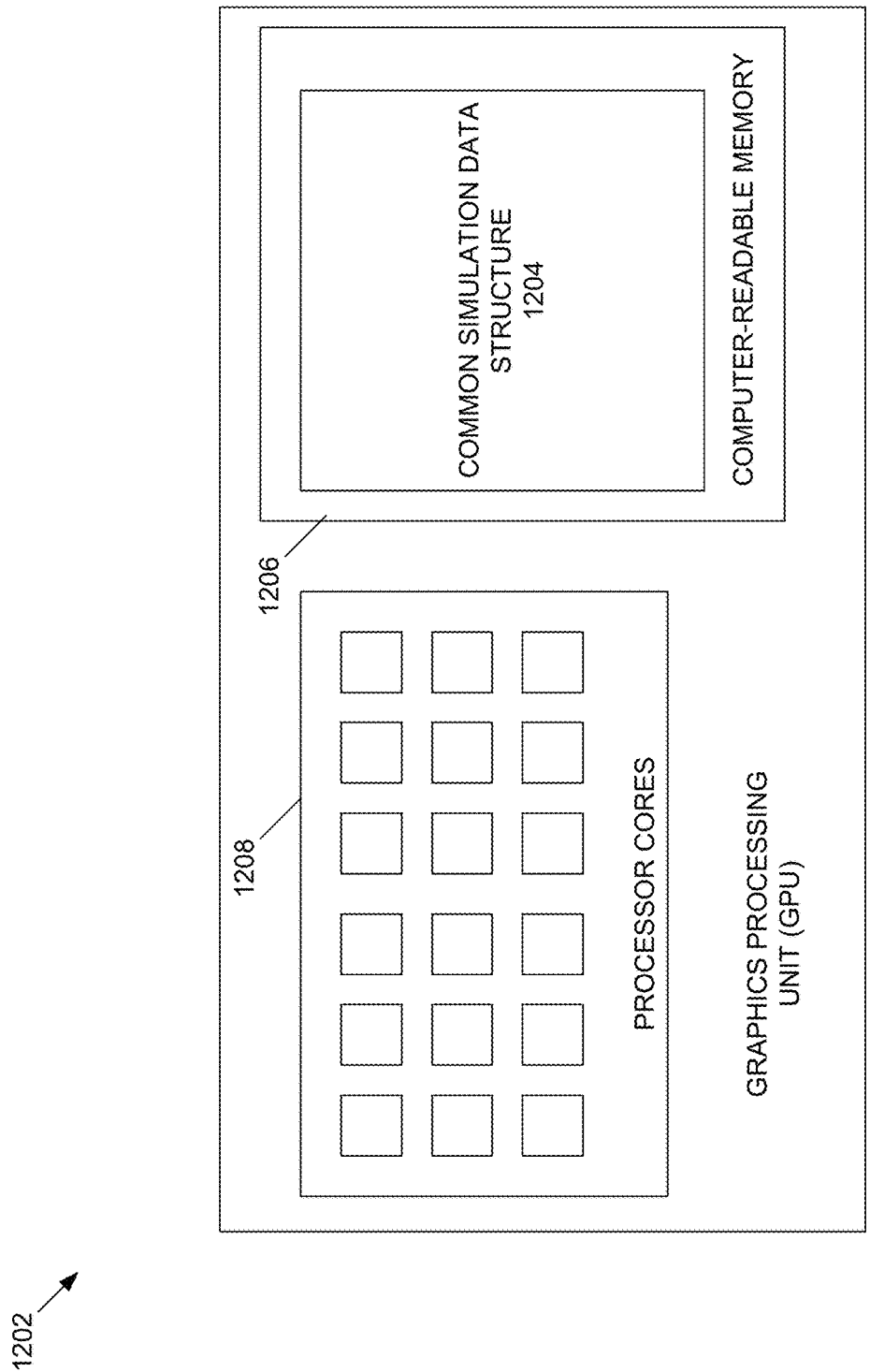
FIG. 12 is a diagram depicting an example hardware configuration for implementing a real-time iterative system simulation engine.

FIG. 12 is a diagram depicting an example hardware configuration for implementing a real-time iterative system simulation engine. A processor-implemented system 1202 for providing real-time interactive simulation of a physical system to generate comparisons of varying system configurations under different physical conditions includes a common simulation data structure 1204 stored on a computer-readable medium 1206, such as a memory. The common simulation data structure contains data (e.g., data of the system configuration stack of FIG. 11) that is utilized by multiple modules for sharing data associated with a physical system.

Operating on one or more data processors, such as a parallel processing architecture of a graphics processing unit 1208 (e.g., having 40 or more processor cores), a system of solvers accesses data associated with an initial system configuration. The solver system stores the initial system configuration data (e.g., part characteristics, environment conditions) in the common simulation data structure 1204. The solver system executes an initial simulation of the physical system to determine an initial value for a metric of interest using the parallel processing architecture 1208. The solver system stores the initial value in the common simulation data structure 1204. A post processor module, operating on the data processors 1208, accesses the data from the common simulation data structure 1204 to generate pixel data based on a user-changeable point of view. The pixel data is stored by the post-processor in the common simulation data structure 1204. A visualizer module, operating on the data processors 1208, accesses the pixel data and the initial metric of interest value to generate a display on a graphical user interface that displays the part in the physical system from the point of view according to the physical system characteristic data, the display further including a display of the initial value for the metric of interest.

Upon receiving a system configuration change through a user interface manipulation, the solver recalculates the simulation of the physical system to determine a second value for the metric based on the manipulation. The second value for the metric is stored in the common simulation data structure 1204. The second metric is displayed on the graphical user interface by the visualizer along with the initial value in real time relative to the received manipulation.

The use of the single, common data structure across the solver system module, the post-processor module, and the visualizer module can collectively and significantly improve system performance substantially. Use of separate data structures and storage across modules requires data transmission and translation, where such data transmission and translation is not included in one embodiment of the disclosure that uses the common data structure 1204. For physical systems, which can be represented by millions or billions of geometric subsections, such data transmission and translation could hamper the ability of a system to provide real-time simulation results and interactivity.

As discussed herein, in addition to characteristics of a part being simulated, a real-time iterative system simulation engine can utilize system condition data, such as data indicative of an environment in which the part resides.

Figure 13:
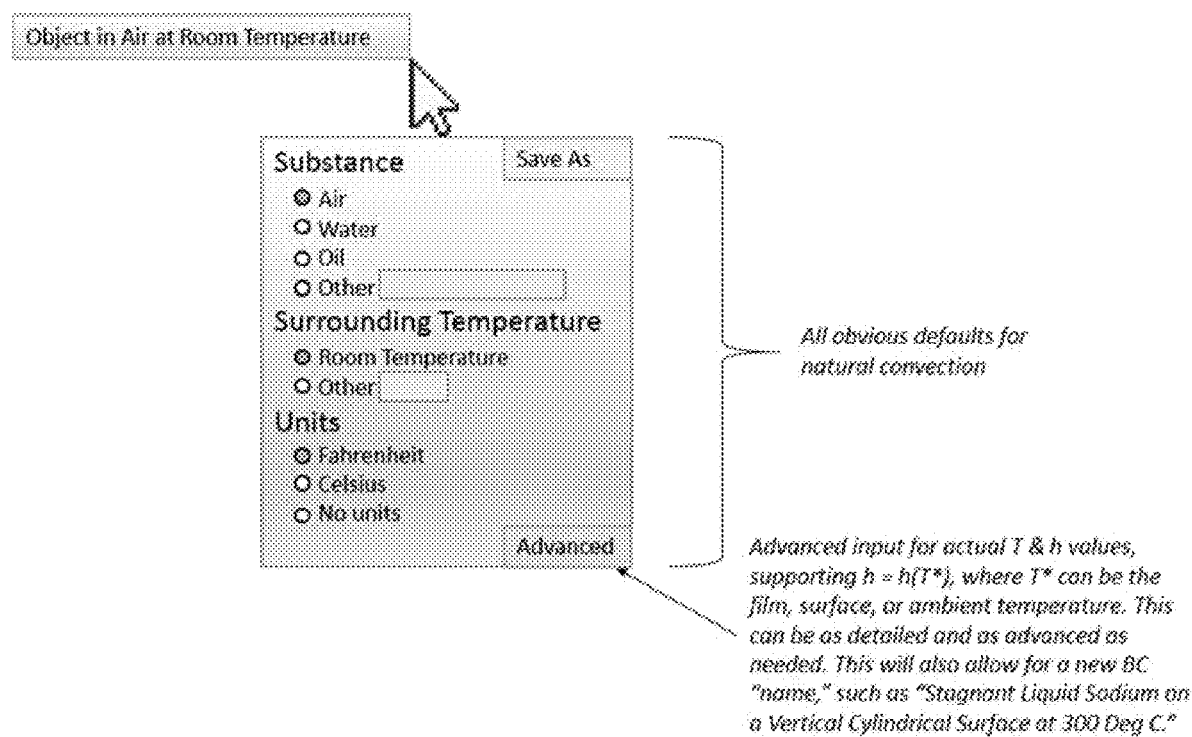
FIG. 13 provides a user interface for defining environment conditions for a substance (e.g., air, water, oil) in a volume surrounding a part being designed.
Figure 14:
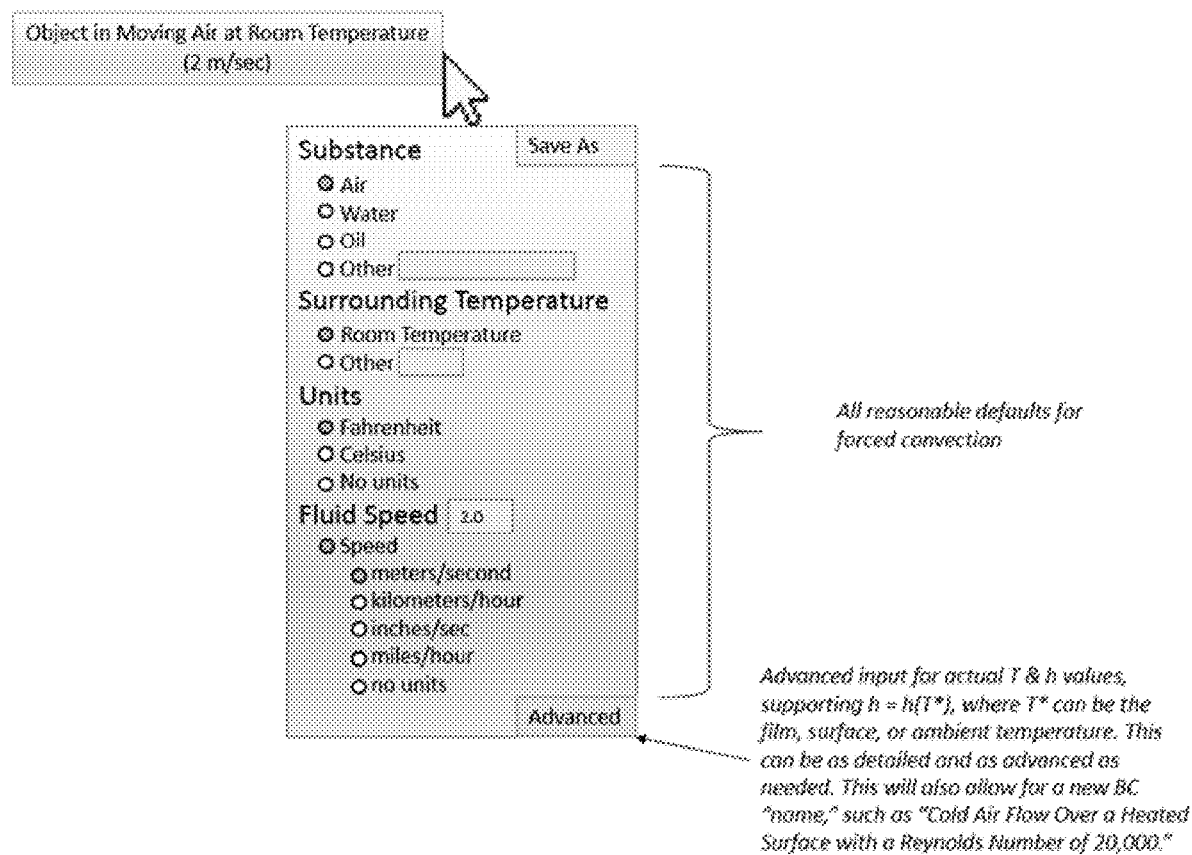
FIG. 14 depicts a user interface for defining environment conditions for a moving substance (e.g., moving air, moving water) in a volume surrounding the part being designed.
Figure 15:
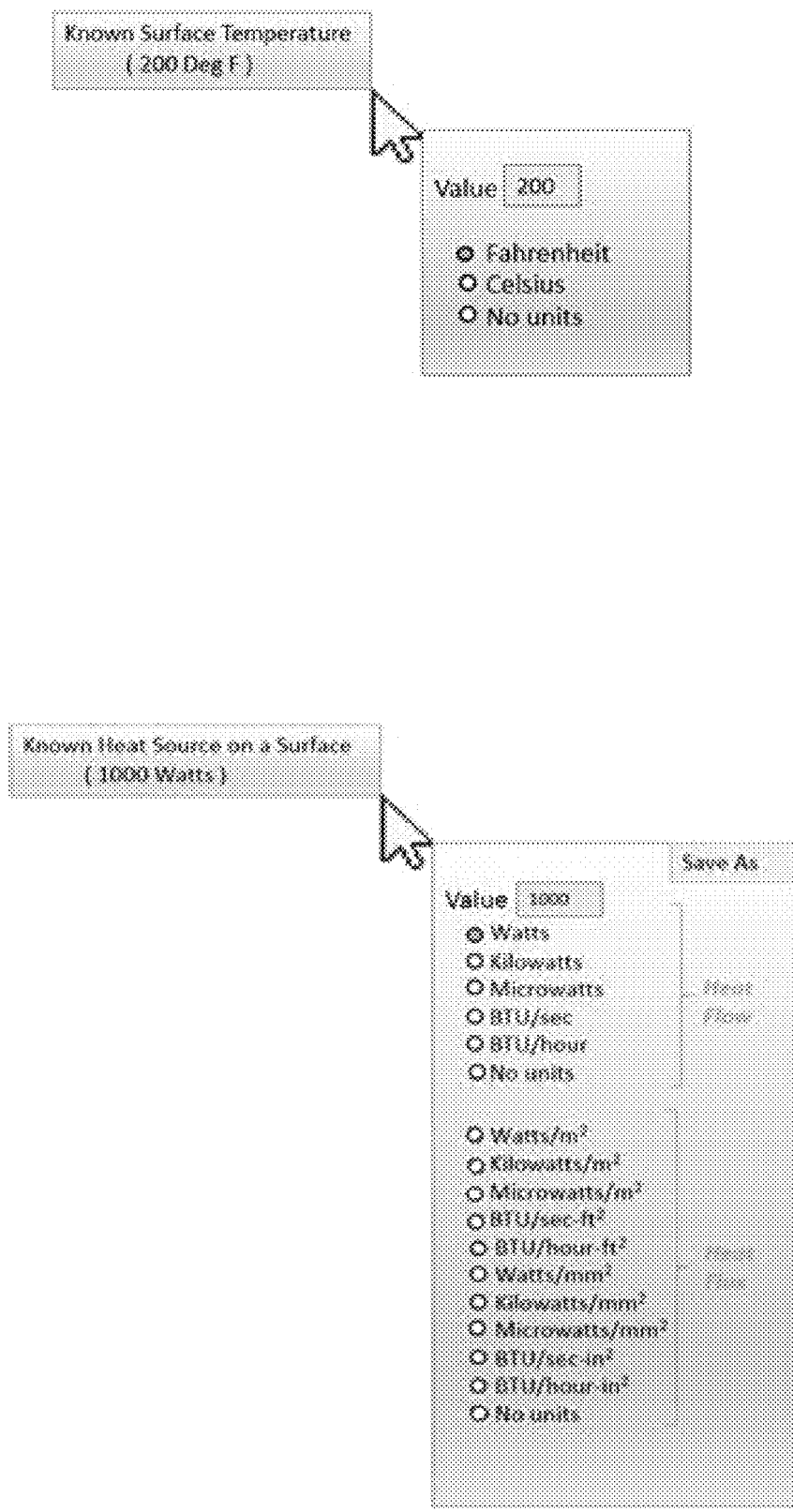
FIG. 15 includes a first user interface for defining a known temperature at a surface as a boundary condition and a second user interface for defining a known heat source on a surface.
Figure 16:
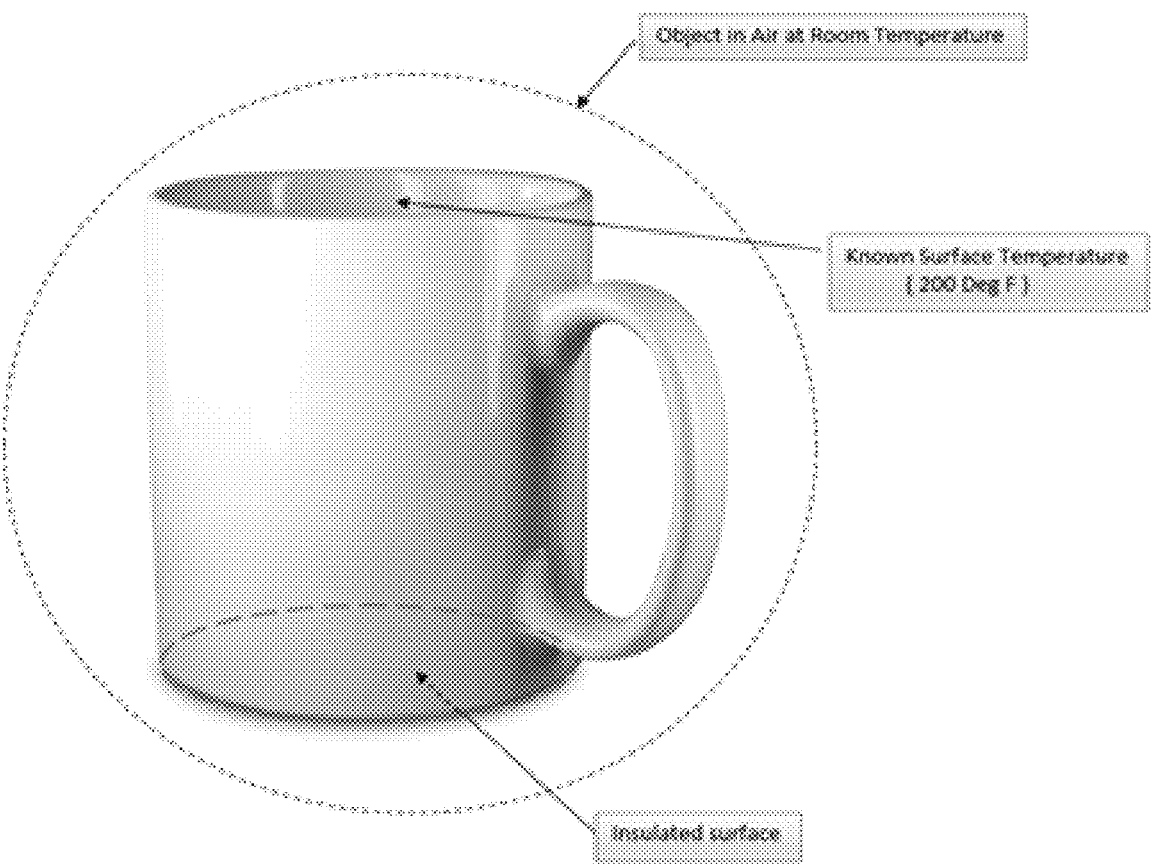
FIG. 16 depicts a mug part being analyzed and the location of effects of different boundary and other environment conditions that can be defined for a physical system.

FIGS. 13-15 depict example interfaces for defining environment conditions, such as for the mug part depicted in FIG. 16. FIG. 13 provides a user interface for defining environment conditions for a substance (e.g., air, water, oil) in a volume surrounding a part being designed. The interface enables selection of characteristics of the substance as well as a temperature of the substance. FIG. 14 depicts a user interface for defining environment conditions for a moving substance (e.g., moving air, moving water) in a volume surrounding the part being designed. The user interface of FIG. 14 adds a control for setting the speed of the substance. FIG. 15 includes a first user interface for defining a known temperature at a surface as a boundary condition and a second user interface for defining a known heat source on a surface. Example temperature boundary conditions include a known surface temperature, an insulated surface, a known heat source on a surface, an object in air at a defined temperature, and an object in moving air at a defined temperature. FIG. 16 depicts a mug part being analyzed and the location of effects of different boundary and other environment conditions that can be defined for a physical system.

Figure 17:
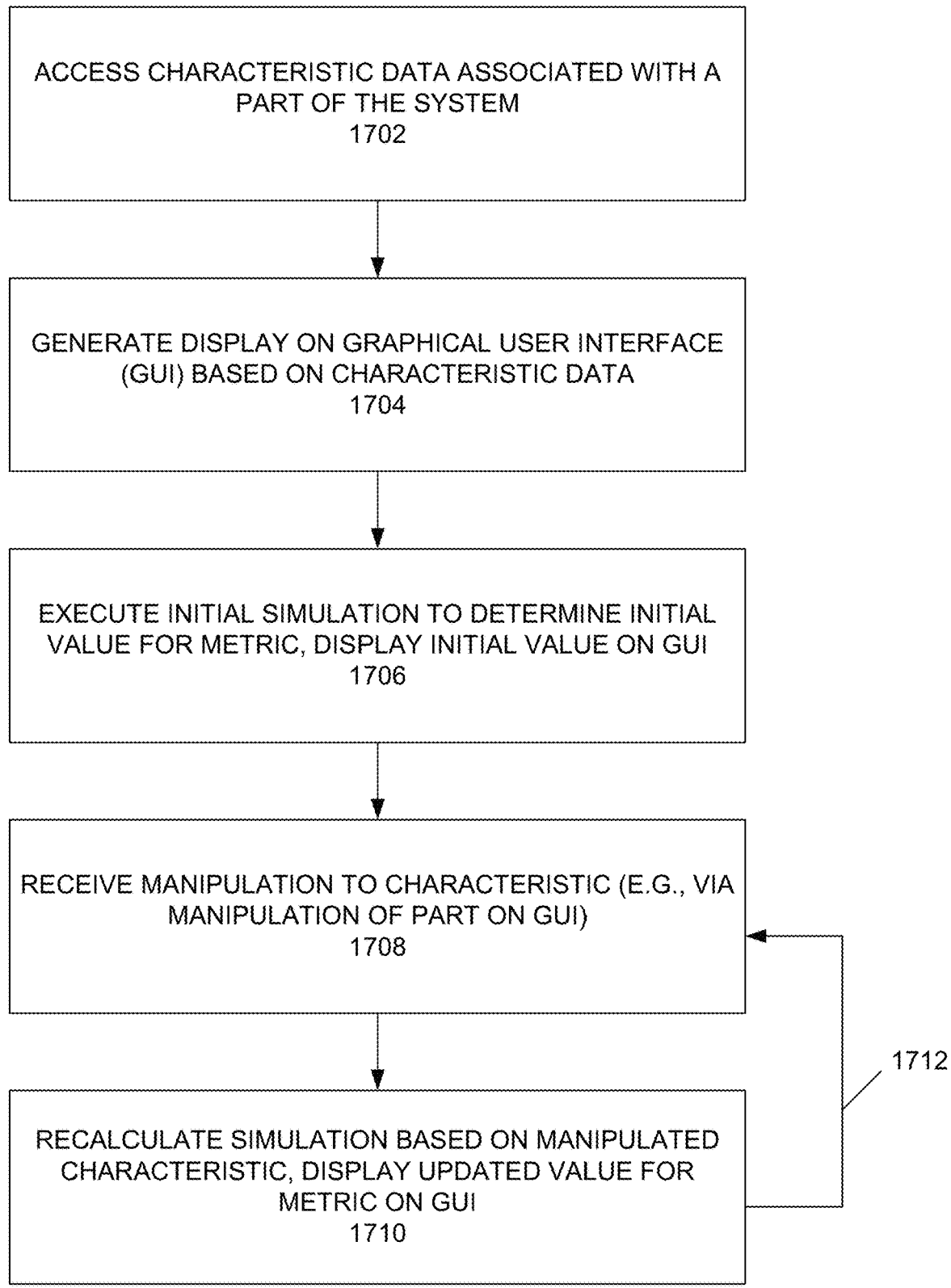
FIG. 17 is a flow diagram depicting a method for providing real-time interactive simulation of a physical system to generate comparisons of varying system configurations under different physical conditions.

FIG. 17 is a flow diagram depicting a method for providing real-time interactive simulation of a physical system to generate comparisons of varying system configurations under different physical conditions. At 1702, data associated with an initial system configuration is accessed, where initial system configuration values include characteristic data associated with a part of the physical system, the characteristic data being indicative of one or more physical characteristics of a corresponding physical part. At 1704, a display is generated on a graphical user interface that displays the part in the physical system according to the characteristic data. An initial simulation of the physical system is executed at 1706 to determine an initial value for a metric using a parallel processing architecture, the initial value for the metric being based on the characteristic data and an environment condition. The initial value is displayed on the graphical user interface. A system configuration change is received at 1708 through a user interface manipulation to a first characteristic of the characteristic data or the environment condition, the first characteristic being associated with a physical characteristic of the part. The simulation of the physical system is recalculated at 1710 to determine a second value for the metric based on the manipulated first characteristic, the second value for the metric being displayed on the graphical user interface along with initial value in real-time relative to the received manipulation. As illustrated at 1712, iterative system configuration changes are received through successive user interface manipulations to characteristic data and, for each system configuration change, the simulation is recalculated based on the most recent manipulation to display subsequent values for the metric on the graphical user interface, where the display of the initial value, the second value, and the subsequent value indicate a progression of a design of the physical system across multiple configurations.

This application uses examples to illustrate the invention. The patentable scope of the invention includes other examples.

It is claimed:

1. A processor-implemented method of providing real-time interactive design and simulation of a physical system to generate comparisons of varying system configurations under different physical conditions, comprising:
   accessing data associated with an initial system configuration, wherein initial system configuration values include characteristic data associated with a part of the physical system, the characteristic data being indicative of one or more physical characteristics of a corresponding physical part;
   generating a display on a graphical user interface that displays the part in the physical system according to the characteristic data;
   executing an initial simulation of the physical system to determine an initial value for a metric using a parallel processing architecture, the initial value for the metric being based on the characteristic data and an environment condition;
   displaying the initial value on the graphical user interface;
   receiving a system configuration change through a user interface manipulation to a first characteristic of the characteristic data or the environment condition, the first characteristic being associated with a physical characteristic of the part;
   recalculating the simulation of the physical system to determine a second value for the metric based on the manipulated first characteristic, the second value for the metric being displayed on the graphical user interface along with initial value in real time relative to the received manipulation; and
   receiving iterative system configuration changes through successive user interface manipulations to characteristic data and, for each system configuration change, recalculating the simulation based on the most recent manipulation to display subsequent values for the metric on the graphical user interface, the display of the initial value, the second value, and the subsequent value indicating a progression of a design of the physical system across multiple configurations.

2. The method of claim 1, further comprising, providing a control to return to a prior system configuration, wherein the first characteristic and the metric are reverted to values associated with the prior system configuration upon selection of the control.

3. The method of claim 1, wherein the metric is a metric for the physical system selected from the group comprising: a maximum response value, a minimum response value, a mean response value, a maximum response flux, and a mean response flux, wherein response values comprise temperatures, structural deformations, heat flows, stresses, strains, velocities, pressures, voltages, electric fields, or magnetic fields, and wherein fluxes comprise heat flows, fluid flows, electric currents, and electrical or magnetic field flows.

4. The method of claim 1, further comprising:
   defining a measurement entity within the physical system;
   wherein the metric is associated with a computed or derived quantity and includes:
      a maximum value, a minimum value, a mean value, or a total value for the metric associated with the measurement entity.

5. The method of claim 4, wherein the measurement entity is a point, edge, line, surface, volume, plane or sphere.

6. The method of claim 4, wherein the measurement entity is redefined, wherein a current value for the metric is recalculated based on the redefined measurement surface.

7. The method of claim 6, wherein recalculating the current value comprises restarting the simulation.

8. The method of claim 2, wherein the initial value, the second value, and the subsequent values are displayed on the graphical user interface in graph form.

9. The method of claim 8, wherein the graph form facilitates comparison of effects of the manipulations on the metric.

10. The method of claim 8, wherein the control is associated with the graph, wherein selection of a data point on the graph activates the control.

11. The method of claim 1, wherein one or more of the iterative manipulations are further manipulations of the first characteristic.

12. The method of claim 11, wherein one or more of the iterative manipulations are manipulations of a second characteristic of the part.

13. The method of claim 1, wherein the first characteristic is a geometric characteristic or a material characteristic of the part.

14. The method of claim 13, wherein the geometric characteristic is manipulated via a drag operation on the displayed part on the graphical user interface.

15. The method of claim 1, wherein the initial simulation and the recalculatings of the simulation also determine values for a second metric, wherein the values for the second metric are also displayed on the graphical user interface in real time along with the values for the metric.

16. The method of claim 1, wherein the display of the part is augmented in real time based on the received manipulation to the first characteristic.

17. The method of claim 2, further comprising:
receiving an undo command via the control;
based on the received undo command, reverting a last manipulation to the characteristic data and removing a most recent subsequent value from the graphical user interface.

18. The method of claim 2, further comprising:
receiving a refresh command via the control;
based on the received refresh command, removing all values but a most recent subsequent value from the graphical user interface.

19. The method of claim 1, wherein the environment condition is a boundary condition of the physical system.

20. The method of claim 19, wherein the boundary condition is a temperature boundary condition selected from the group comprising: a known surface temperature, an insulated surface, a known heat source on a surface, an object in air at a defined temperature, an object in moving air at a defined temperature.

21. The method of claim 1, wherein the second value for the metric is displayed within fifteen seconds of the manipulation.

22. The method of claim 1, wherein the second value for the metric is continuously calculated and displayed in parallel with user manipulation in real time.

23. The method of claim 1, wherein the simulation is automatically recalculated in response to different system configuration changes in real time.

24. The method of claim 1, wherein the parallel processing architecture includes at least 40 processors.

25. The method of claim 1, wherein the parallel processing architecture includes a graphics processing unit.

26. The method of claim 1, wherein recalculating the simulation comprises continuing the simulation.

27. The method of claim 1, wherein the part is a physical component having physical characteristics that include a length, a width, a height, and a material.

28. The method of claim 1, wherein the interactive design and simulation of the physical system is a computer aided design composed of mechanical parts and assemblies in a representation of an operating environment.

29. The method of claim 1, wherein the different physical conditions comprise different operating environments.

30. A processor-implemented system for providing real-time interactive simulation of a physical system to generate comparisons of varying system configurations under different physical conditions, comprising:
a common simulation data structure stored on a computer-readable medium configured to be utilized by multiple modules for sharing data associated with a physical system;
a solver system operating on one or more data processors to access data associated with an initial system configuration, wherein initial system configuration values include characteristic data associated with a part of the physical system, the characteristic data being indicative of one or more physical characteristics of a corresponding physical part, the solver system storing initial system configuration data in the common simulation data structure;
the solver system executing an initial simulation of the physical system to determine an initial value for a metric using a parallel processing architecture, the initial value for the metric being based on the characteristic data and an environment condition, the solver system storing the environment condition and the initial value for the metric in the common simulation data structure;
a post-processor operating on one or more data processors to access the characteristic data, the environment condition and the initial value for the metric to generate pixel data based on a user-changeable point of view, the pixel data being stored in the common simulation data structure;
a visualizer operating on one or more data processors to access the pixel data and the initial value from the common simulation data structure and to generate a display on a graphical user interface that displays the part in the physical system from the point of view according to the characteristic data, the display further including a display of the initial value;
upon receiving a system configuration change through a user interface manipulation to a first characteristic of the characteristic data, the solver recalculating the simulation of the physical system to determine a second value for the metric based on the manipulated first characteristic, the second value for the metric being stored in the common simulation data structure and displayed on the graphical user interface by the visualizer along with the initial value in real time relative to the received manipulation.

31. The system of claim 30, wherein the common data structure facilitates real-time interactive simulation that utilizes the solver, post-processor, and visualizer.

32. The system of claim 30, wherein data from the common data structure is utilized by the solver, post-processor, and visualizer without translation.

* * * * *